(12) United States Patent
Oh et al.

(10) Patent No.: US 11,750,165 B2
(45) Date of Patent: Sep. 5, 2023

(54) VIBRATION GENERATING APPARATUS, OPERATING METHOD THEREOF, AND APPARATUS INCLUDING VIBRATION GENERATING APPARATUS

(71) Applicant: LG DISPLAY CO., LTD., Seoul (KR)

(72) Inventors: JunSeok Oh, Paju-si (KR); MinHo Sohn, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/547,553

(22) Filed: Dec. 10, 2021

(65) Prior Publication Data

US 2022/0209733 A1    Jun. 30, 2022

(30) Foreign Application Priority Data

Dec. 31, 2020 (KR) .................. 10-2020-0190063

(51) Int. Cl.
| *H04R 3/00* | (2006.01) |
| *H03G 3/30* | (2006.01) |
| *H04R 29/00* | (2006.01) |
| *H04R 1/02* | (2006.01) |
| *H04R 17/00* | (2006.01) |

(52) U.S. Cl.
CPC .......... *H03G 3/3036* (2013.01); *H04R 1/028* (2013.01); *H04R 3/00* (2013.01); *H04R 17/00* (2013.01); *H04R 29/001* (2013.01); *G01K 2217/00* (2013.01); *H03G 2201/103* (2013.01); *H04R 2430/01* (2013.01); *H04R 2499/15* (2013.01)

(58) Field of Classification Search
CPC .......... H04R 1/028; H04R 3/00; H04R 17/00; H04R 29/001; H04R 2430/01; H04R 2499/15; H04R 1/005; H04R 3/002; H04R 3/04; H04R 2400/13; H04R 3/007; H04R 2499/13

USPC .............................................. 381/55, 58–59
See application file for complete search history.

(56) References Cited

U.S. PATENT DOCUMENTS

| 8,774,419 B2* | 7/2014 | Risbo ................. H03G 11/008 |
| | | 381/94.8 |
| 10,271,151 B2* | 4/2019 | Polleros ................ H04R 9/022 |
| 10,667,050 B2* | 5/2020 | Moritoki ................ H04R 3/08 |
| 10,670,453 B2* | 6/2020 | Miyata ............... H01L 41/0533 |

(Continued)

*Primary Examiner* — Disler Paul
(74) *Attorney, Agent, or Firm* — POLSINELLI PC

(57) ABSTRACT

A vibration generating apparatus comprises a vibration apparatus and a vibration driving circuit including a driving signal generator configured to supply a driving signal to the vibration apparatus, wherein the driving signal generator is configured to adjust a frequency-based gain compensation value based on at least one of a circuit internal temperature value of the vibration driving circuit and a temperature prediction value of the vibration apparatus corresponding to a current value of an $n^{th}$ driving signal, compensate for a frequency-based gain value based on the adjusted frequency-based gain compensation value, compensate for an $(n+1)^{th}$ driving signal based on the compensated frequency-based gain value, and supply the compensated $(n+1)^{th}$ driving signal to the vibration apparatus.

22 Claims, 7 Drawing Sheets

(56) References Cited

U.S. PATENT DOCUMENTS

| | | | | |
|---|---|---|---|---|
| 10,966,006 B2* | 3/2021 | Ozcan | ................... | G06F 1/1688 |
| 2019/0273997 A1* | 9/2019 | Takahashi | ............... | H03F 3/181 |
| 2021/0391702 A1* | 12/2021 | Yang | ........................ | H02H 9/02 |

* cited by examiner

VIBRATION GENERATING APPARATUS, OPERATING METHOD THEREOF, AND APPARATUS INCLUDING VIBRATION GENERATING APPARATUS

CROSS-REFERENCE TO RELATED APPLICATION

This application claims the priority of Korean Patent Application No. 10-2020-0190063 filed on Dec. 31, 2020, which is hereby incorporated by reference in its entirety.

BACKGROUND

Field of the Disclosure

The present disclosure relates to a vibration generating apparatus, an operating method thereof, and an apparatus including the vibration generating apparatus.

Description of the Background

Apparatuses for generating a vibration include a piezoelectric element. A capacitance is generated in the piezoelectric element based on a structure of the piezoelectric element, and the capacitance in the piezoelectric element varies with temperature variations.

Since the capacitance in the piezoelectric element affects a driving signal which is output from a vibration driving circuit and supplied to the piezoelectric element, a variation of the capacitance in the piezoelectric element changes the driving signal. When an undesired driving signal is supplied to the piezoelectric element, the piezoelectric element does not normally operate.

SUMMARY

Accordingly, the present disclosure is to provide a vibration generating apparatus, an operating method thereof, and an apparatus including the vibration generating apparatus that substantially obviate one or more problems due to limitations and disadvantages described above.

The present disclosure is also to provide a vibration generating apparatus configured to supply a driving signal where a characteristic is not changed by a temperature environment, an operating method of the vibration generating apparatus, and an apparatus including the vibration generating apparatus.

The present disclosure also is to provide a vibration generating apparatus, an operating method thereof, and an apparatus including the vibration generating apparatus, which predict an internal temperature value of a vibration apparatus based on a current value of a driving signal, compensate for the driving signal based on the predicted internal temperature value of the vibration apparatus, and supply the compensated driving signal to the vibration apparatus.

The present disclosure is also to provide a vibration generating apparatus, an operating method thereof, and an apparatus including the vibration generating apparatus, which compensate for a driving signal based on an internal temperature value of a vibration driving circuit and supply the compensated driving signal to a vibration apparatus.

Further, the present disclosure is to provide a vibration generating apparatus, an operating method thereof, and an apparatus including the vibration generating apparatus, which compensate for a driving signal based on an internal temperature value of a vibration driving circuit and an internal temperature value of a vibration apparatus predicted based on a current value of the driving signal and supply the compensated driving signal to the vibration apparatus.

Additional features and aspects will be set forth in part in the description that follows, and in part will become apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the present disclosure as embodied and broadly described herein, a vibration generating apparatus comprises a vibration apparatus, and a vibration driving circuit including a driving signal generator configured to supply a driving signal to the vibration apparatus, the driving signal generator is configured to adjust a frequency-based gain compensation value based on at least one of a circuit internal temperature value of the vibration driving circuit and a temperature prediction value of the vibration apparatus corresponding to a current value of an $n^{th}$ driving signal, compensate for a frequency-based gain value based on the adjusted frequency-based gain compensation value, compensate for an $(n+1)^{th}$ driving signal based on the compensated frequency-based gain value, and supply the compensated $(n+1)^{th}$ driving signal to the vibration apparatus.

In another aspect of the present disclosure, an apparatus comprises a vibration member, and a vibration generating apparatus vibrating the vibration member and comprising a vibration apparatus, and a vibration driving circuit including a driving signal generator supplying a driving signal to the vibration apparatus, and the driving signal generator is configured to adjust a frequency-based gain compensation value based on at least one or more of a circuit internal temperature value of the vibration driving circuit and a temperature prediction value of the vibration apparatus corresponding to a current value of an $n^{th}$ driving signal, compensate for a frequency-based gain value based on the set or adjusted frequency-based gain compensation value, compensate for an $(n+1)^{th}$ driving signal based on the compensated frequency-based gain value, and supply the compensated $(n+1)^{th}$ driving signal to the vibration apparatus.

In a further aspect of the present disclosure, an operating method of a vibration generating apparatus, the operating method comprises supplying an $n^{th}$ driving signal to a vibration apparatus, measuring a circuit internal temperature value of a vibration driving circuit, measuring a driving signal current value of the $n^{th}$ driving signal, adjusting a temperature prediction value of the vibration apparatus corresponding to the driving signal current value, and generating an $(n+1)^{th}$ driving signal and compensating for the $(n+1)^{th}$ driving signal based on a compensation value.

In a further aspect of the present disclosure, a vibration apparatus driver for providing a driving signal to a vibration apparatus comprises a temperature measurer, configured to measure a circuit internal temperature value of the vibration apparatus driver; a temperature predictor, configured to predict a temperature prediction value of the vibration apparatus based on a current value of the driving signal; and a driving signal generator, configured to adjust a compensation value for the driving signal based on at least one of the circuit internal temperature value of the vibration apparatus driver and the temperature prediction value of the vibration apparatus, and compensate for the driving signal based on the compensation value to output a compensated driving signal.

A vibration generating apparatus and an operating method thereof according to an aspect of the present disclosure may predict an internal temperature value of a vibration apparatus based on a current value of a driving signal, compensate for the driving signal based on the predicted internal temperature value of the vibration apparatus, and supply the compensated driving signal to the vibration apparatus, thereby offsetting an adverse effect caused by the internal temperature of the vibration apparatus while the driving signal is flowing in the vibration apparatus.

A vibration generating apparatus and the operating method thereof according to an aspect of the present disclosure may compensate for the driving signal based on an internal temperature value of a vibration driving circuit and supply the compensated driving signal to the vibration apparatus, thereby offsetting an adverse effect caused by the internal temperature of the vibration driving circuit while the driving signal is flowing in the vibration driving circuit.

A vibration generating apparatus and the operating method thereof according to an aspect of the present disclosure may compensate for the driving signal based on the internal temperature value of the vibration driving circuit and the internal temperature value of the vibration apparatus predicted based on a current value of the driving signal and may supply the compensated driving signal to the vibration apparatus, thereby offsetting an adverse effect caused by the internal temperature of the vibration driving circuit while the driving signal is flowing in the vibration driving circuit and offsetting an adverse effect caused by the internal temperature of the vibration apparatus while the driving signal is flowing in the vibration apparatus.

A vibration generating apparatus and the operating method thereof according to an aspect of the present disclosure may supply the vibration apparatus with the driving signal compensated for based on an internal temperature environment of the vibration apparatus and an internal temperature environment of the vibration driving circuit, thereby allowing the vibration apparatus to vibrate based on the compensated driving signal so as to be suitable for a temperature environment. Accordingly, a reduction in characteristic of a sound generated by a vibration of a vibration member based on a vibration of the vibration apparatus may be minimized.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

Figure 1:
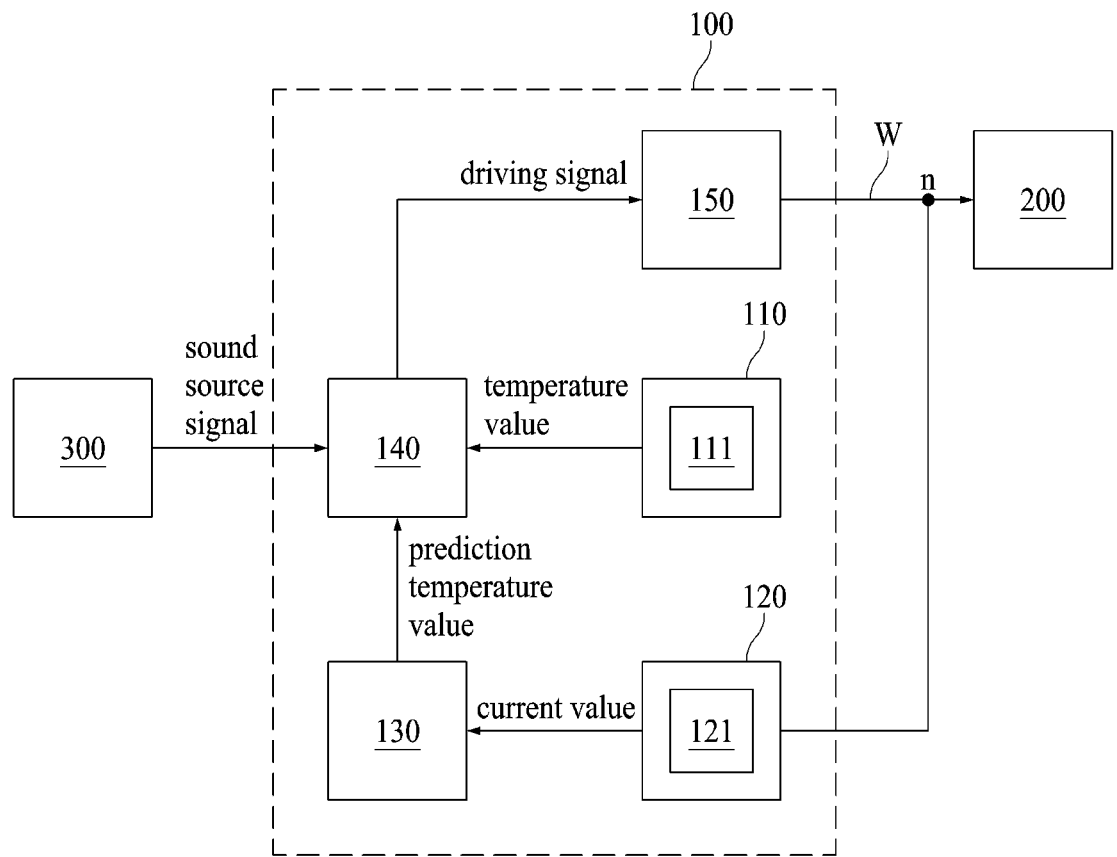
FIG. 1 illustrates a vibration generating apparatus according to an aspect of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing aspects of the present disclosure are merely an example, and thus, the aspects of present disclosure are not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" and "direct(ly)" is used.

In the description of aspects, when a structure is described as being positioned "on or above" or "under or below" another structure, this description should be construed as including a case in which the structures contact each other as well as a case in which a third structure is disposed therebetween.

In describing a time relationship, for example, when the temporal order is described as, for example, "after," "subsequent," "next," and "before," a case that is not continuous may be included unless a more limiting term, such as "just," "immediate(ly)," and "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element is "connected," "coupled," or "adhered" to another element or layer, the element or layer can not only be directly connected or adhered to another element or layer, but also be indirectly connected or adhered to another element or layer with one or more intervening elements or layers "disposed," or "interposed" between the elements or layers, unless otherwise specified.

In the description of aspects, when a structure is described as being positioned "on or above or over" or "under or below" another structure, this description should be construed as including a case in which the structures contact each other as well as a case in which a third structure is disposed therebetween. The size and thickness of each element shown in the drawings are given merely for the convenience of description, and aspects of the present disclosure are not limited thereto, unless otherwise specified. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the present disclosure, an apparatus may include a display apparatus such as an organic light emitting display (OLED) module, a liquid crystal module (LCM), or the like including a display panel and a driver for driving the display panel. Also, the apparatus may include a set device (or a set apparatus) or a set electronic device such as a notebook computer, a TV, a computer monitor, an equipment apparatus including an automotive apparatus and another type apparatus for vehicles, or a mobile electronic device such as a smartphone or an electronic pad, which is a complete product (or a final product) including an LCM, an OLED module, or the like.

Therefore, in the present disclosure, examples of the apparatus may include a display apparatus itself, such as an LCM and an OLED module, and a set device (or a set apparatus) which is a final consumer device or an application product including the LCM or the OLED module.

In some aspects, an LCM or an OLED module including a display panel and a driver may be referred to as a display apparatus, and an electronic device which is a final product including an LCM or an OLED module may be referred to as a set device. For example, the display apparatus may include a display panel, such as an LCD and an OLED, and a source printed circuit board (PCB) which is a controller for driving the display panel. The set device may further include a set PCB which is a set controller electrically connected to the source PCB to overall control the set device.

A display panel applied to an aspect of the present disclosure may use all types of display panels such as a liquid crystal display panel, an organic light emitting diode (OLED) display panel, and an electroluminescent display panel, or the like, but aspects of the present disclosure are not limited. For example, the display panel may be a display panel capable of generating a sound by being vibrated by a vibration apparatus according to aspects of the present disclosure. A display panel applied to a display apparatus according to aspects of the present disclosure are not limited a shape or a size of the display panel.

For example, when the display panel is the liquid crystal display panel, the display panel may include a plurality of gate lines, a plurality of data lines, and a plurality of pixels respectively provided at a plurality of pixel areas defined by intersections of the gate lines and the data lines. Also, the display panel may include an array substrate including a thin film transistor (TFT) which is a switching element for adjusting a light transmittance of each of the plurality of pixels, an upper substrate including a color filter and/or a black matrix or the like, and a liquid crystal layer between the array substrate and the upper substrate.

When the display panel is the organic light emitting display panel (OLED), the display panel may include a plurality of gate lines, a plurality of data lines, and a plurality of pixels respectively provided at a plurality of pixel areas defined by intersections of the gate lines and the data lines. Also, the display panel may include an array substrate including a TFT which is an element for selectively applying a voltage to each of the pixels, an organic light emitting device layer on the array substrate, and an encapsulation substrate disposed at the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer, for example, a nano-sized material layer, a quantum dot, a light emitting layer, or the like. As another aspect of the present disclosure, the layer provided on the array substrate may include a micro light emitting diode.

The display panel may further include a backing such as a metal plate attached at the display panel. However, aspects of the present disclosure are not limited to the metal plate, and the display panel may further include another structure.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

The accompanying drawings, which are included to provide a further understanding of the present disclosure and are incorporated in and constitute a part of this application, illustrate aspects of the disclosure and together with the description serve to explain the principle of the disclosure. However, the technical features of the present disclosure are not limited to specific drawings, and features disclosed in the drawings may be combined with each other to form a new aspect.

Hereinafter, aspects of the present disclosure will be described in detail with reference to the accompanying drawings. For convenience of description, a scale of each of elements illustrated in the accompanying drawings differs from a real scale, and thus, aspects of the present disclosure are not limited to a scale illustrated in the drawings.

FIG. 1 illustrates a vibration generating apparatus according to an aspect of the present disclosure.

With reference to FIG. 1, the vibration generating apparatus according to an aspect of the present disclosure may include a vibration driving circuit (or a vibration driving integrated circuit (IC) or a sound processing circuit) 100 and a vibration apparatus 200, but a configuration of the vibration generating apparatus is not limited thereto. For example, the vibration generating apparatus may include one or more vibration apparatus 200.

The vibration driving circuit 100 according to an aspect of the present disclosure may be supplied with a sound source signal from a sound source supply system 300 to generate a driving signal corresponding to the sound source signal and may supply the driving signal to the vibration apparatus 200. For example, the vibration driving circuit 100 may supply the driving signal to the vibration apparatus 200 to vibrate the vibration apparatus 200, thereby vibrating a vibration member (or a vibration object) with the vibration apparatus 200 provided therein.

According to an aspect of the present disclosure, the vibration driving circuit 100 may be configured to predict an internal temperature value of the vibration apparatus 200 based on a current value of the driving signal (or a vibration driving signal or a sound signal) supplied to the vibration apparatus 200 and may be configured to compensate for the driving signal based on the predicted internal temperature value (or a temperature prediction value of a vibration apparatus). For example, the temperature prediction value of the vibration apparatus may be a temperature variation value based on a variation of a capacitance of the vibration apparatus 200. A variation of the capacitance of the vibration apparatus 200 may affect the driving signal, and thus, a current value of the driving signal may vary. The vibration driving circuit 100 according to an aspect of the present disclosure may adjusted the temperature prediction value of the vibration apparatus based on the current value of the driving signal which varies based on the variation of the capacitance. According to an aspect of the present disclosure, as the driving signal is compensated for based on the temperature prediction value of the vibration apparatus, the variation of the capacitance of the vibration apparatus 200 affecting the driving signal flowing in the vibration apparatus 200 may be offset.

According to an aspect of the present disclosure, the vibration driving circuit 100 may be configured to supply an $n^{th}$ driving signal to the vibration apparatus 200, and then, may be configured to predict an internal temperature value of the vibration apparatus 200 based on a current value of the $n^{th}$ driving signal. For example, the vibration driving circuit 100 may be configured to compensate for the driving signal based on an internal temperature value (or a circuit internal temperature value) of the vibration driving circuit 100. For example, the vibration driving circuit 100 may be configured to compensate for the driving signal based on the temperature prediction value of the vibration apparatus and the circuit internal temperature value.

The vibration driving circuit 100 according to an aspect of the present disclosure may include a temperature measurer 110, a current measurer 120, a temperature predictor 130, a driving signal generator 140, and an amplifier 150, but a configuration of the vibration driving circuit 100 is not limited thereto.

The temperature measurer (or a temperature measurement circuit) 110 may be disposed in the vibration driving circuit 100 and may be configured to measure an internal temperature value of the vibration driving circuit 100. For example, the temperature measurer 110 may be configured to supply the measured temperature value to the driving signal generator 140.

According to an aspect of the present disclosure, the temperature measurer 100 may be configured to measure a temperature value of at least one or more region of the vibration driving circuit 100. For example, the temperature measurer 110 may be configured to measure a temperature value of at least one or more region largely affecting the driving signal of regions in the vibration driving circuit 100. For example, the temperature measurer 100 may be configured to measure temperature values of a plurality of regions in the vibration driving circuit 100.

According to an aspect of the present disclosure, the temperature measurer 110 may be disposed adjacent to the amplifier 150 which finally outputs the driving signal and may be configured to measure a temperature value of an adjacent region of the amplifier 150, but aspects of the present disclosure are not limited thereto. For example, the temperature measurer 110 may include at least one temperature sensor 111. For example, the at least one temperature sensor 111 may be disposed adjacent to the amplifier 150, but aspects of the present disclosure are not limited thereto.

The current measurer (or a current measurement circuit) 120 may be configured to measure a current value of the driving signal supplied from the vibration driving circuit 100 to the vibration apparatus 200. For example, the current measurer 120 may be configured to supply the measured current value to the temperature predictor 130.

According to an aspect of the present disclosure, the current measurer 120 may be connected to a line W between the vibration driving circuit 100 and the vibration apparatus 200 and may be configured to measure the current value of the driving signal. For example, the current measurer 120 may be connected to a portion n of the line W adjacent to the vibration apparatus 200. For example, when the current value of the driving signal is measured at the portion n of the line W adjacent to the vibration apparatus 200, a current value similar to the current value of the driving signal flowing in the vibration apparatus 200 may be measured.

According to an aspect of the present disclosure, a current value measured by the current measurer 120 may be configured to predict an internal temperature of the vibration apparatus 200, and thus, when a current value similar to the current value flowing in the vibration apparatus 200 is measured, an internal temperature of the vibration apparatus 200 may be accurately predicted. For example, the current measurer 120 may include at least one or more current sensor 121. For example, the at least one or more current sensor 121 may be connected to the portion n, which is adjacent to the vibration apparatus 200, of a portion of the line W between the vibration driving circuit 100 and the vibration apparatus 200.

The temperature predictor (or a temperature predictor of a vibration apparatus or a current-temperature converter) 130 may be supplied with a current value from the current measurer 120 and may output a temperature prediction value (or a temperature prediction value of a vibration apparatus) of the vibration apparatus 200 to the driving signal generator 140.

According to an aspect of the present disclosure, the temperature predictor 130 may apply a current-temperature table so as to output a temperature prediction value of a vibration apparatus corresponding to the current value from the current measurer 120. For example, the current-temperature table may include the current value of the driving signal supplied from the vibration driving circuit 100 to the vibration apparatus 200 and a temperature prediction value of a vibration apparatus matching the current value. For example, the current-temperature table may be a table which includes a temperature prediction value of a vibration apparatus corresponding to each driving signal current value. For example, when the temperature predictor 130 is supplied with the current value from the current measurer 120, the temperature predictor 130 may be configured to output a temperature value matching the supplied current value with reference to the current-temperature table.

In addition, the temperature predictor 130 may predict the internal temperature of the vibration apparatus 200 based on multiple current values, and the multiple current values include, for example, the current value of the nth driving signal and current values of one or more driving signals before the nth driving signal. In this case, for example, the current-temperature table may include a correspondence relationship between multiple current values and the temperature prediction value.

The driving signal generator 140 may be supplied with a sound source signal from the sound source supply system 300. For example, the driving signal generator 140 may be supplied with an internal temperature value (or a circuit internal temperature value or a first temperature value) of the vibration driving circuit 100 measured by the temperature measurer 110. For example, the driving signal generator 140 may be supplied with the temperature prediction value of the vibration apparatus (or a temperature prediction value or a second temperature value) from the temperature predictor 130.

The driving signal generator 140 may be configured to generate a driving signal corresponding to the sound source signal from the sound source supply system 300. For example, the driving signal generator 140 may be configured to output the generated driving signal to the amplifier 150. For example, the driving signal generator 140 may be configured to compensate for the driving signal and may be configured to output the compensated driving signal to the amplifier 150. For example, the driving signal generator 140 may be configured to compensate for a frequency-based gain value based on a frequency-based gain compensation value and may be configured to compensate for the driving signal based on the compensated frequency-based gain value.

According to an aspect of the present disclosure, the driving signal generator 140 may be configured to compensate for the driving signal based on the circuit internal temperature value from the temperature measurer 110, and then, may be configured to output the compensated driving signal. For example, the driving signal generator 140 may be configured to compensate for the driving signal based on the temperature prediction value of the vibration apparatus from the temperature predictor 130, and then, may be configured to output the compensated driving signal. For example, the driving signal generator 140 may be configured to compensate for the driving signal based on the circuit internal temperature value from the temperature measurer 110 and the temperature prediction value of the vibration apparatus from the temperature predictor 130, and then, may be configured to output the compensated driving signal.

The driving signal generator 140 may apply a temperature-compensation table so as to compensate for the driving signal.

According to an aspect of the present disclosure, the driving signal generator 140 may apply a first temperature-compensation table so as to compensate for the driving signal based on the circuit internal temperature value from the temperature measurer 110.

According to an aspect of the present disclosure, the first temperature-compensation table may include the circuit internal temperature value supplied from the temperature measurer 110 and a compensation value matching the circuit internal temperature value. For example, the first temperature-compensation table may be a table including a compensation value corresponding to each circuit internal temperature value. For example, the compensation value may be a frequency-based gain compensation value. However, the embodiment of the present disclosure is not limited thereto, for example, the compensation value may simply be a gain compensation value not based on frequency.

According to an aspect of the present disclosure, when the circuit internal temperature value is supplied from the temperature measurer 110, the driving signal generator 140 may adjusted (determine, check, or extract) a compensation value matching the circuit internal temperature value in the first temperature-compensation table, apply the adjusted compensation value to the driving signal to compensate for the driving signal, and output the compensated driving signal.

According to an aspect of the present disclosure, the driving signal generator 140 may be configured to adjust a frequency-based gain compensation value matching the circuit internal temperature value, compensate for a frequency-based gain of the driving signal by the adjusted frequency-based gain compensation value, and be configured to apply the compensated frequency-based gain to the driving signal to compensate for the driving signal.

According to an aspect of the present disclosure, the driving signal generator 140 may apply a second temperature-compensation table so as to compensate for the driving signal based on the temperature prediction value of the vibration apparatus from the temperature predictor 130. According to an aspect of the present disclosure, the second temperature-compensation table may include the temperature prediction value of the vibration apparatus supplied from the temperature predictor 130 and a compensation value matching the temperature prediction value of the vibration apparatus. For example, the second temperature-compensation table may be a table including a compensation value corresponding to each temperature prediction value of the vibration apparatus. For example, the compensation value may be a frequency-based gain compensation value.

According to an aspect of the present disclosure, when the temperature prediction value of vibration apparatus is supplied from the temperature predictor 130, the driving signal generator 140 may adjust a compensation value matching the temperature prediction value of the vibration apparatus in the second temperature-compensation table, apply the adjusted compensation value to the driving signal to compensate for the driving signal, and output the compensated driving signal.

According to an aspect of the present disclosure, the driving signal generator 140 may be configured to adjust a frequency-based gain compensation value matching the temperature prediction value of the vibration apparatus, compensate for a frequency-based gain of the driving signal by the adjusted frequency-based gain compensation value, and apply the compensated frequency-based gain to the driving signal to compensate for the driving signal.

According to an aspect of the present disclosure, the driving signal generator 140 may apply a third temperature-compensation table so as to compensate for the driving signal based on the circuit internal temperature value from the temperature measurer 110 and the temperature prediction value of the vibration apparatus from the temperature predictor 130. According to an aspect of the present disclosure, the third temperature-compensation table may include a compensation value matching the circuit internal temperature value from the temperature measurer 110 and the temperature prediction value of the vibration apparatus from the temperature predictor 130. For example, the third temperature-compensation table may be a table including a compensation value corresponding to each circuit internal temperature value and each temperature prediction value of the vibration apparatus. Here, the compensation value may be a frequency-based gain compensation value.

According to an aspect of the present disclosure, when the circuit internal temperature value is supplied from the temperature measurer 110 and the temperature prediction value of the vibration apparatus is supplied from the temperature predictor 130, the driving signal generator 140 may be configured to adjust a compensation value matching the circuit internal temperature value and the temperature prediction value of the vibration apparatus in the third temperature-compensation table, apply the adjusted compensation value to the driving signal to compensate for the driving signal, and output the compensated driving signal.

According to an aspect of the present disclosure, the driving signal generator 140 may be configured to adjust a frequency-based gain compensation value matching the circuit internal temperature value and the temperature prediction value of the vibration apparatus, compensate for a frequency-based gain of the driving signal by the adjusted frequency-based gain compensation value, and apply the compensated frequency-based gain to the driving signal to compensate for the driving signal.

The vibration driving circuit 100 according to an aspect of the present disclosure may be configured to predict an internal temperature value of the vibration apparatus 200 based on a current value of the driving signal, compensate for the driving signal based on the predicted internal temperature value of the vibration apparatus 200, and supply the compensated driving signal to the vibration apparatus 200, thereby offsetting an adverse effect caused by the internal temperature of the vibration apparatus 200 while the driving signal is flowing in the vibration apparatus 200.

The vibration driving circuit 100 according to an aspect of the present disclosure may be configured to compensate for the driving signal based on an internal temperature value of the vibration driving circuit 100 and supply the compensated driving signal to the vibration apparatus 200, thereby offsetting an adverse effect caused by the internal temperature of the vibration driving circuit 100 while the driving signal is flowing in the vibration driving circuit 100.

The vibration driving circuit 100 according to an aspect of the present disclosure may be configured to compensate for the driving signal based on the internal temperature value of the vibration driving circuit 100 and the internal temperature value of the vibration apparatus 200 predicted based on the current value of the driving signal and may be configured to supply the compensated driving signal to the vibration apparatus 200, thereby offsetting an adverse effect caused by the internal temperature of the vibration driving circuit 100 while the driving signal is flowing in the vibration driving circuit 100 and offsetting an adverse effect caused by the internal temperature of the vibration apparatus 200 while the driving signal is flowing in the vibration apparatus 200.

Therefore, the vibration driving circuit 100 according to an aspect of the present disclosure may be configured to supply the vibration apparatus 200 with the driving signal compensated for based on an internal temperature environment of the vibration apparatus 200 and an internal temperature environment of the vibration driving circuit 100, thereby allowing the vibration apparatus 200 to vibrate based on the compensated driving signal so as to be suitable for a temperature environment. Accordingly, a reduction in characteristic of a sound generated by a vibration of a vibration member based on a vibration of the vibration apparatus 200 may be minimized.

The amplifier 150 may be supplied with the driving signal from the driving signal generator 140, amplify the supplied driving signal based on the adjusted gain, and supply the amplified driving signal to the vibration apparatus 200.

The vibration apparatus 200 according to an aspect of the present disclosure may be disposed at a vibration member. For example, the vibration apparatus 200 may be supplied with the driving signal from the vibration driving circuit 100 and may vibrate based on the supplied driving signal to vibrate the vibration member, thereby allowing the vibration member to provide a sound and/or haptic feedback. For example, the vibration apparatus 200 may be provided as one or in plurality. For example, when the vibration apparatus 200 is provided in plurality, the plurality of vibration apparatuses 200 may be supplied with the same driving signal, or may be supplied with different driving signals. For example, the vibration apparatus 200 may be a piezoelectric element or a film-type vibration apparatus. For example, when the vibration apparatus 200 is provided in plurality, the plurality of vibration apparatuses 200 may be vibration apparatuses of the same type, or may be vibration apparatuses of different types. For example, the vibration apparatus 200 may be configured with one or more of a piezoelectric element and a film type vibration apparatus. For example, the piezoelectric element may be referred to as a piezoelectric device, a piezoelectric apparatus, or the like, but aspects of the present disclosure are not limited thereto.

According to an aspect of the present disclosure, the vibration member may include a display panel including a plurality of pixels configured to display an image, or may include a non-display panel. For example, the vibration member may include a display panel including a plurality of pixels configured to display an image or may be one or more of wood, plastic, glass, cloth, paper, an interior material of a vehicle, a glass window of a vehicle, an inner ceiling of a building, a glass window of a building, an interior material of an aircraft, and a glass window of an aircraft, but aspects of the present disclosure are not limited thereto. For example, the non-display panel may be a light emitting diode lighting panel (or apparatus), an organic light emitting lighting panel (or apparatus), or an inorganic light emitting lighting panel (or apparatus), but aspects of the present disclosure are not limited thereto. For example, the vibration member may include a display panel including a plurality of pixels configured to display an image or may include one or more non-display panels of a light emitting diode lighting panel (or apparatus), an organic light emitting lighting panel (or apparatus), and an inorganic light emitting lighting panel (or apparatus), but aspects of the present disclosure are not limited thereto.

According to another aspect of the present disclosure, the vibration member may include a plate, and the plate may include a metal material or may include one or more single nonmetal or composite nonmetal materials of wood, plastic, glass, cloth, paper, and leather, but aspects of the present disclosure are not limited thereto.

Figure 2:
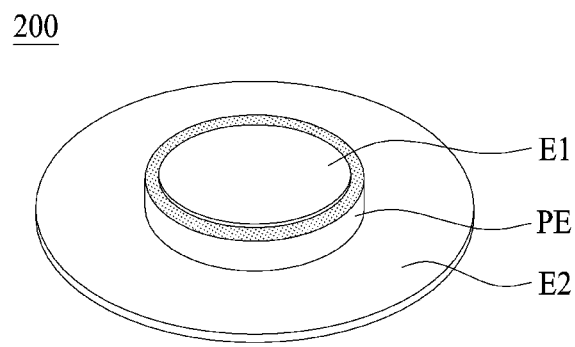
FIG. 2 illustrates a vibration apparatus according to an aspect of the present disclosure.

FIG. 2 illustrates a vibration apparatus according to an aspect of the present disclosure.

With reference to FIG. 2, a vibration apparatus 200 according to an aspect of the present disclosure may include a vibration portion PE, a first electrode layer E1, and a second electrode layer E2. For example, a structure including the vibration portion PE, the first electrode layer E1, and the second electrode layer E2 may be referred to as a vibration structure (or a vibration module) PCM. For example, the vibration apparatus 200 may include at least one vibration structure (or a vibration module) PCM.

The vibration portion PE may include a piezoelectric material (or an electroactive material) which has a piezoelectric effect. For example, the piezoelectric material may have a characteristic in which, when pressure or twisting (or bending) is applied to a crystalline structure by an external force, a potential difference occurs due to dielectric polarization caused by a relative position change of a positive (+) ion and a negative (−) ion, and a vibration is generated by an electric field based on a reverse voltage applied thereto. The vibration portion PE may be referred to as a vibration layer, a piezoelectric layer, a piezoelectric material layer, an electroactive layer, a piezoelectric vibration portion, a piezoelectric material portion, an electroactive portion, a piezoelectric structure, an inorganic material layer, an inorganic material portion, or the like, but aspects of the present disclosure are not limited thereto.

The vibration portion PE may be formed of a transparent, semitransparent, or opaque piezoelectric material (or an electroactive material) and may be transparent, semitransparent (or translucent), or opaque. The vibration portion PE may include a ceramic-based material for generating a relatively high vibration, or may include a piezoelectric ceramic having a perovskite-based crystalline structure. The perovskite crystalline structure may have a piezoelectric effect and an inverse piezoelectric effect, and may be a plate-shaped structure having orientation or alignment. The perovskite crystalline structure may be represented by a chemical formula "ABO$_3$". In the chemical formula, "A" may include a divalent metal element, and "B" may include a tetravalent metal element. For example, in the chemical formula "ABO$_3$", "A", and "B" may be cations, and "O" may be anions. For example, the vibration portion PE may include one of lead(II) titanate (PbTiO$_3$), lead zirconate (PbZrO$_3$), lead zirconate titanate(PbZrTiO$_3$), barium titanate (BaTiO$_3$), and strontium titanate (SrTiO$_3$), but aspects of the present disclosure are not limited thereto.

The vibration portion PE according to an aspect of the present disclosure may include a lead zirconate titanate (PZT)-based material, including lead (Pb), zirconium (Zr), and titanium (Ti); or may include a lead zirconate nickel niobate (PZNN)-based material, including lead (Pb), zirconium (Zr), nickel (Ni), and niobium (Nb), but aspects of the present disclosure are not limited thereto. Also, the vibration portion PE may include at least one or more of calcium titanate (CaTiO$_3$), barium titanate (BaTiO$_3$), and strontium titanate (SrTiO$_3$), each without Pb, but aspects of the present disclosure are not limited thereto.

The vibration portion PE according to an aspect of the present disclosure may include a circular shape, an oval shape, or a polygonal shape, but aspects of the present disclosure are not limited thereto.

The first electrode layer E1 may be disposed at a first surface (or an upper surface) of the vibration portion PE and may be electrically connected to the first surface of the vibration portion PE. For example, the first electrode layer E1 may have a single-body electrode (or a common electrode type) which is disposed at a whole first surface of the vibration portion PE. For example, the first electrode layer E1 may have the same shape as the vibration portion PE, but aspects of the present disclosure are not limited thereto. The first electrode layer E1 according an aspect of the present disclosure may include a transparent conductive material, a semitransparent conductive material, or an opaque conductive material. For example, the transparent conductive material or the semitransparent conductive material may include indium tin oxide (ITO) or indium zinc oxide (IZO), but not limited thereto. The opaque conductive material may include aluminum (Al), copper (Cu), gold (Au), silver (Ag), molybdenum (Mo), magnesium (Mg), or an alloy of any thereof, or the like, but aspects of the present disclosure are not limited thereto.

The second electrode layer E2 may be disposed at a second surface (or a rear surface) opposite to the first surface of the vibration portion PE, and may be electrically connected to the second surface of the vibration portion PE. For example, the second electrode layer E2 may have a single-body electrode (or a common electrode type) which is disposed at a whole second surface of the vibration portion PE. For example, the second electrode layer E2 may have a greater size than the vibration portion PE and have the same shape as the vibration portion PE, but aspects of the present disclosure are not limited thereto. The second electrode layer E2 according to an aspect of the present disclosure may include a transparent conductive material, a semitransparent conductive material, or an opaque conductive material. For example, the second electrode layer E2 may include the same material as the first electrode layer E1, but aspects of the present disclosure are not limited thereto. As another aspect of the present disclosure, the second electrode layer E2 may include a material different from the first electrode layer E1.

The vibration portion PE may be polarized by a certain voltage applied to the first electrode layer E1 and the second electrode layer E2 in a certain temperature atmosphere, or in a temperature atmosphere that may be changed from a high temperature to a room temperature, but aspects of the present disclosure are not limited thereto. For example, the vibration portion PE may alternately and repeatedly contract and expand based on an inverse piezoelectric effect according to a driving signal (or a voice signal) applied to the first electrode layer E1 and the second electrode layer E2 from the outside to vibrate.

The vibration apparatus 200 according to an aspect of the present disclosure may further include a first protection member and a second protection member.

The first protection member may be disposed over the first electrode layer E1 and may protect the first electrode layer E1. For example, the first protection member may include a plastic material, a fiber material, or a wood material, but aspects of the present disclosure are not limited thereto.

The second protection member may be disposed over the second electrode layer E2 and may protect the second electrode layer E2. For example, the second protection member may include a plastic material, a fiber material, or a wood material, but aspects of the present disclosure are not limited thereto. For example, the first protection member may include a material which is the same as or different from the second protection member. One or more of the first protection member and the second protection member may be attached or coupled to a display panel (or a vibration member) by an adhesive member.

Figure 3:
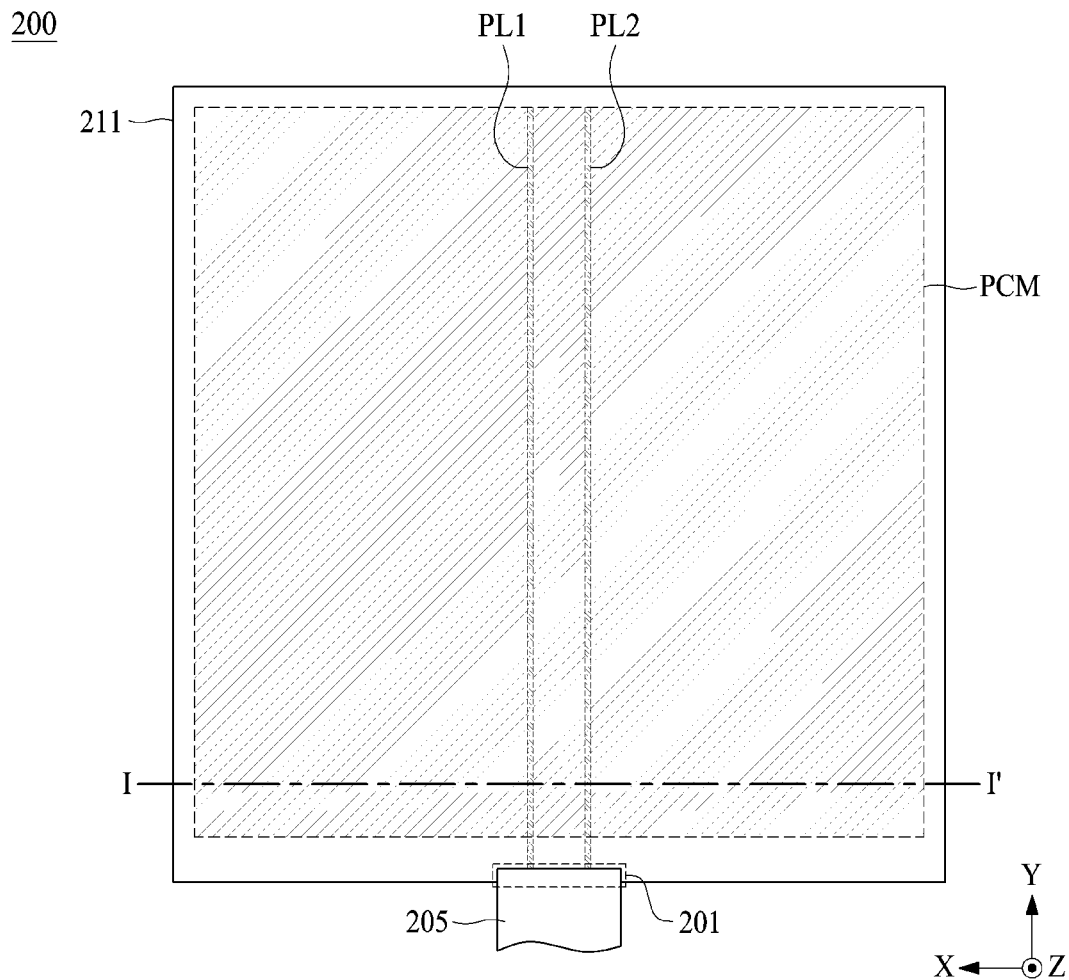
FIG. 3 illustrates a vibration apparatus according to another aspect of the present disclosure.
Figure 4:
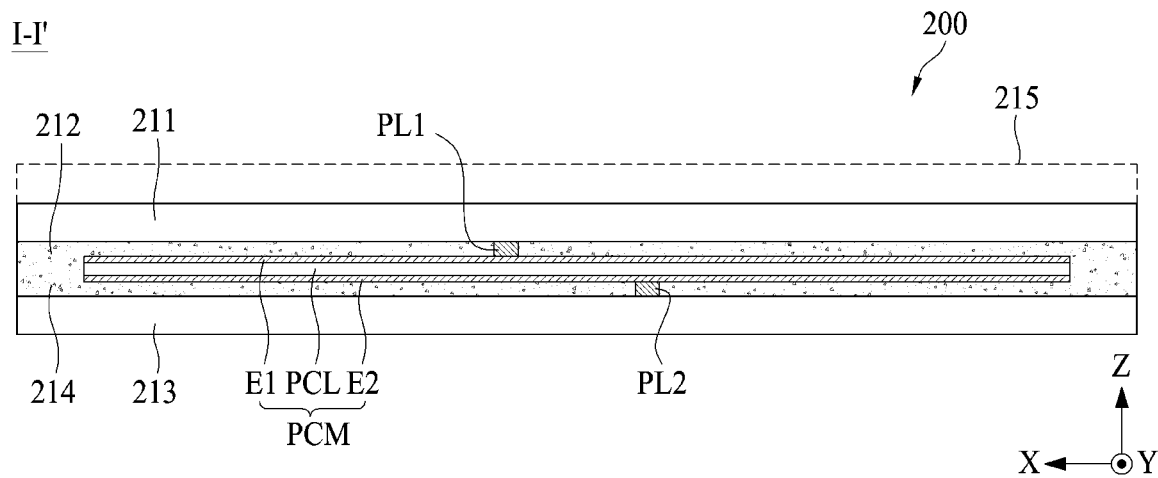
FIG. 4 is a cross-sectional view taken along line I-I' illustrated in FIG. 3.

FIG. 3 illustrates a vibration apparatus according to another aspect of the present disclosure. FIG. 4 is a cross-sectional view taken along line I-I' illustrated in FIG. 3.

With reference to FIGS. 3 and 4, the vibration apparatus 200 according to an aspect of the present disclosure may alternately and/or repeatedly contract and expand based on a piezoelectric effect (or a piezoelectric characteristic) or an inverse piezoelectric effect (or an inverse piezoelectric characteristic) to vibrate.

The vibration apparatus 200 according to another aspect of the present disclosure may alternately and/or repeatedly contract and expand based on an inverse piezoelectric effect to vibrate in a thickness direction Z, thereby directly vibrating a vibration object. The vibration apparatus 200 according to another aspect of the present disclosure may have a tetragonal shape or a square shape, but aspects of the present disclosure are not limited thereto.

The vibration apparatus 200 according to another aspect of the present disclosure may be include a vibration portion PCL, a first electrode layer E1, and a second electrode layer E2. For example, a structure including the vibration portion PCL, the first electrode layer E1, and the second electrode layer E2 may be referred to as a vibration structure (or a vibration module) PCM. For example, the vibration apparatus 200 may include at least one vibration structure (or vibration module) PCM.

The vibration portion PCL may include a piezoelectric material, a composite piezoelectric material, or an electroactive material, and the piezoelectric material, the composite piezoelectric material and the electroactive material may have a piezoelectric effect. The vibration portion PCL may be referred to as a vibration layer, a piezoelectric material layer, a piezoelectric composite layer, an electroactive layer, a piezoelectric material portion, a piezoelectric composite portion, an electroactive portion, a piezoelectric structure, a piezoelectric composite structure, or a piezoelectric ceramic composite structure, but aspects of the present disclosure are not limited thereto.

The vibration portion PCL according to another aspect of the present disclosure may include a ceramic-based material capable of realizing a relatively high vibration. For example, the vibration portion PCL may include a 1-3 composite structure or a 2-2 composite structure. For example, a piezoelectric deformation coefficient "$d_{33}$" of the vibration portion PCL in a thickness direction Z may have 1,000 pC/N or more, but aspects of the present disclosure are not limited thereto.

The first electrode layer E1 may be disposed over a first surface (or an upper surface) of the vibration portion PCL and may be electrically connected to the first surface of the vibration portion PCL. For example, the first electrode layer E1 may have a single-body electrode type (or a common electrode type) which is disposed at a whole first surface of the vibration portion PCL. The first electrode layer E1 according another aspect of the present disclosure may include a transparent conductive material, a semitransparent (or translucent) conductive material, or an opaque conductive material. For example, examples of the transparent conductive material or the semitransparent conductive material may include indium tin oxide (ITO) or indium zinc oxide (IZO), but aspects of the present disclosure are not limited thereto. The opaque conductive material may include aluminum (Al), copper (Cu), gold (Au), silver (Ag), molybdenum (Mo), magnesium (Mg), or the like, and an alloy of any thereof, but aspects of the present disclosure are not limited thereto.

The second electrode layer E2 may be over a second surface (or a rear surface) opposite to the first surface of the vibration portion PCL and may be electrically connected to the second surface of the vibration portion PCL. For example, the second electrode layer E2 may have a single-body electrode type (or a common electrode type) which is disposed at a whole second surface of the vibration portion PCL. The second electrode layer E2 according to another aspect of the present disclosure may include a transparent conductive material, a semitransparent conductive material, or an opaque conductive material. For example, the second electrode layer E2 may include the same material as the first electrode layer E1, but aspects of the present disclosure are not limited thereto. As another aspect of the present disclosure, the second electrode layer E2 may include a material different from the first electrode layer E1.

The vibration portion PCL may be polarized by a certain voltage applied to the first electrode layer E1 and the second electrode layer E2 in a certain temperature atmosphere, or in a temperature atmosphere that may be changed from a high temperature to a room temperature, but aspects of the present disclosure are not limited thereto.

The vibration apparatus 200 according to another aspect of the present disclosure may further include a first protection member 211 and a second protection member 213.

The first protection member 211 may be disposed over the first surface of the vibration structure PCM. For example, the first protection member 211 may cover the first electrode layer E1 disposed over the first surface of the vibration portion PCL. Thus, the first protection member 211 may support the first surface of the vibration structure PCM and may protect the first surface of the vibration portion PCL or the first electrode layer E1.

The first protection member 211 according to another aspect of the present disclosure may be disposed at the first surface of the vibration structure PCM by a first adhesive layer 212. For example, the first protection member 211 may be directly disposed at the first surface of the vibration structure PCM by a film laminating process using the first adhesive layer 212.

The second protection member 213 may be disposed over the second surface of the vibration structure PCM. For example, the second protection member 213 may cover the second electrode layer E2 disposed on the second surface of the vibration portion PCL. Thus, the second protection member 213 may support the second surface of the vibration structure PCM and may protect the second surface of the vibration portion PCL or the second electrode layer E2.

The second protection member 213 according to another aspect of the present disclosure may be disposed at the second surface of the vibration structure PCM by a second adhesive layer 214. For example, the second protection member 213 may be directly disposed at the second surface of the vibration structure PCM by a film laminating process using the second adhesive layer 214.

Each of the first protection member 211 and the second protection member 213 according to another aspect of the present disclosure may include a plastic film. For example, each of the first protection member 211 and the second protection member 213 may be a polyimide (PI) film or a polyethylene terephthalate (PET) film, but aspects of the present disclosure are not limited thereto.

The first adhesive layer 212 may be disposed at the first surface of the vibration structure PCM. For example, the first adhesive layer 212 may be formed on a rear surface (or an inner surface) of the first protection member 211 facing the first surface of the vibration structure PCM and disposed at the first surface of the vibration structure PCM.

The second adhesive layer 214 may be disposed at the second surface of the vibration structure PCM. For example, the second adhesive layer 214 may be formed on a front surface (or an inner surface) of the second protection member 213 facing the second surface of the vibration structure PCM and disposed at the second surface of the vibration structure PCM.

The vibration structure PCM may be surrounded by the first and second adhesive layers 212 and 214. For example, the first and second adhesive layers 212 and 214 may entirely surround the whole vibration structure PCM. For example, the first and second adhesive layers 212 and 214 may be referred to as a cover member, but aspects of the present disclosure are not limited thereto. When each of the first and second adhesive layers 212 and 214 is a cover member, the first protection member 211 may be disposed at a first surface of the cover member, and the second protection member 213 may be disposed at a second surface of the cover member. For example, for convenience of description, the first and second adhesive layers 212 and 214 are illustrated as first and second adhesive layers 212 and 214, but aspects of the present disclosure are not limited thereto and may be provided as one adhesive layer.

Each of the first and second adhesive layers 212 and 214 according to another aspect of the present disclosure may include an electric insulating material which has adhesiveness and may include a material capable of compression and decompression. For example, each of the first and second adhesive layers 212 and 214 may include an epoxy resin, an acrylic resin, a silicone resin, or a urethane resin, but aspects of the present disclosure are not limited thereto.

The vibration apparatus 200 according to another aspect of the present disclosure may further include a first power supply line PL1, a second power supply line PL2, and a pad part 201.

The first power supply line PL1 may be disposed at the first protection member 211. For example, the first power supply line PL1 may be disposed at a rear surface of the first protection member 211 facing the first surface of the vibration portion PCL. The first power supply line PL1 may be electrically connected to the first electrode layer E1 of the vibration structure PCM. For example, the first power supply line PL1 may be directly and electrically connected to the first electrode layer E1 of the vibration structure PCM. For example, the first power supply line PL1 may be electrically connected to the first electrode layer E1 of the vibration structure PCM by an anisotropic conductive film. As another aspect of the present disclosure, the first power supply line PL1 may be electrically connected to the first electrode layer E1 of the vibration structure PCM by a conductive material (or particle) included in the first adhesive layer 212.

The second power supply line PL2 may be disposed at the second protection member 213. For example, the second power supply line PL2 may be disposed at a front surface of the second protection member 213 facing the second surface of the vibration portion PCL. The second power supply line PL2 may be electrically connected to the second electrode layer E2 of the vibration structure PCM. For example, the second power supply line PL2 may be directly and electrically connected to the second electrode layer E2 of the vibration structure PCM. For example, the second power supply line PL2 may be electrically connected to the second electrode layer E2 of the vibration structure PCM by an anisotropic conductive film. As another aspect of the present disclosure, the second power supply line PL2 may be electrically connected to the second electrode layer E2 of the vibration structure PCM by a conductive material (or particle) included in the second adhesive layer 214.

The pad part 201 may be electrically connected to the first power supply line PL1 and the second power supply line PL2. For example, the pad part 201 may be electrically connected to one portion (or one end) of each of the first power supply line PL1 and the second power supply line PL2. The pad part 201 according to another aspect of the present disclosure may include a first pad electrode and a second pad electrode. The first pad electrode may be electrically connected to one portion of the first power supply line PL1. The second pad electrode may be electrically connected to one portion of the second power supply line PL2.

The vibration apparatus 200 according to an aspect of the present disclosure may further include a flexible cable 205.

The flexible cable 220 may be electrically connected to the pad part 201 disposed at the vibration apparatus 200 and may supply a driving signal (or a voice signal or a sound signal) provided from a vibration driving circuit 100 to the vibration apparatus 200. The flexible cable 220 according to another aspect of the present disclosure may include a first terminal and a second terminal. A first terminal may be electrically connected to the first pad electrode of the pad part 201. The second terminal may be electrically connected to the second pad electrode of the pad part 201. For example, the flexible cable 220 may be configured with a flexible printed circuit cable or a flexible flat cable, but aspects of the present disclosure are not limited thereto.

The vibration apparatus 200 according to another aspect of the present disclosure may further include a plate 215.

The plate 215 may be disposed at the first protection member 211 or the second protection member 213. For example, the plate 215 may have the same shape as the first protection member 211 (or the second protection member 213). The plate 215 may have a size which is greater than or equal to the first protection member 211 (or the second protection member 213).

The plate 215 according to another aspect of the present disclosure may be disposed at a front surface (or a first surface) of the first protection member 211. The plate 215 may be disposed at the front surface of the first protection member 211 of the vibration apparatus 200 by a connection member. The plate 215 according to another aspect of the present disclosure may be disposed between a vibration member (or a vibration object) and the first protection member 211.

According to another aspect of the present disclosure, the plate 215 may be disposed at a rear surface (or a second surface) of the second protection member 213. The plate 215 may be disposed at the rear surface of the second protection member 213 of the vibration apparatus 200 by a connection member. According to another aspect of the present disclosure, the plate 215 may be disposed between the vibration member (or a vibration object) and the second protection member 213.

The plate 215 according to an aspect of the present disclosure may include a metal material, and for example, may include one or more materials of stainless steel, aluminum (Al), a magnesium (Mg), a magnesium (Mg) alloy, a magnesium-lithium (Mg—Li) alloy, and an Al alloy, but aspects of the present disclosure are not limited thereto. The plate 215 may be disposed at the first protection member 211 (or the second protection member 213) and may reinforce a mass of the vibration apparatus 200 to decrease a resonance frequency of the vibration apparatus 200 based on an increase in mass, and thus, may increase a sound characteristic and a sound pressure level characteristic of the low-pitched sound band generated based on a vibration of the vibration apparatus 200 and may enhance the flatness of a sound characteristic. For example, the flatness of a sound characteristic may be a magnitude of a deviation between a highest sound pressure level and a lowest sound pressure level.

FIGS. 5A to 5F illustrate a vibration portion of the vibration apparatus illustrated in FIG. 4.

Figure 5A:
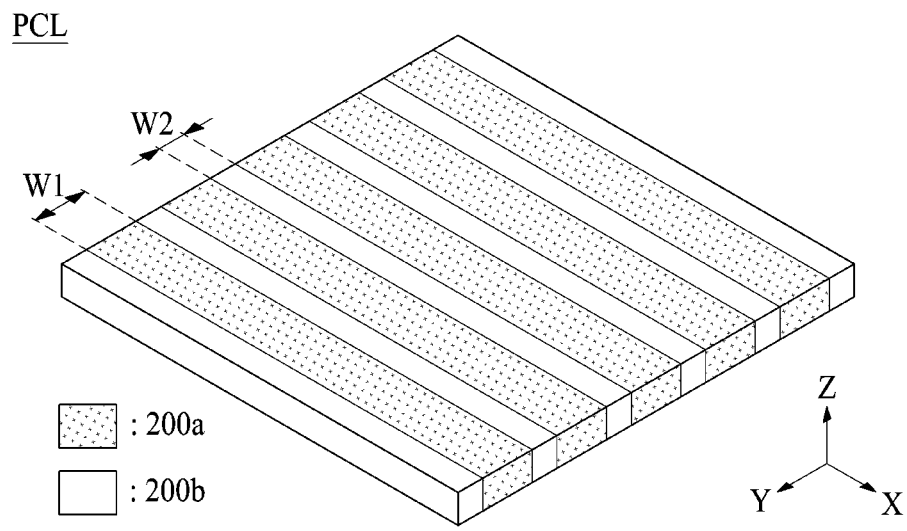
FIGS. 5A to 5F illustrate a vibration portion of the vibration apparatus illustrated in FIG. 4.

With reference to FIGS. 3, 4, and 5A, the vibration portion PCL of the vibration apparatus 200 according to another aspect of the present disclosure may include a first portion 200a and a second portion 200b. For example, the first portion 200a may include an inorganic material, and the second portion 200b may include an organic material. For example, the first part 200a may have a piezoelectric characteristic, and the second part 200b may have a ductile characteristic or flexibility. For example, the inorganic material of the first portion 200a may have piezoelectric characteristic, and the organic material of the second portion 200b may have a ductile characteristic or flexibility.

The vibration portion PCL may include a plurality of first portions 200a and a plurality of second portions 200b. For example, the plurality of first portions 200a and the plurality of second portions 200b may be alternately and repeatedly arranged along a second direction Y. Each of the plurality of first portions 200a may be disposed between two adjacent second portions 200b of the plurality of second portions 200b. For example, each of the plurality of first portions 200a may have a first width W1 parallel to the second direction Y and a length parallel to a first direction X. Each of the plurality of second portions 200b may be disposed in parallel to the second direction Y. For example, each of the plurality of second portions 200b may have a second width W2 and a length parallel to the first direction X. Each of the plurality of second portions 200b may have the same size, for example, the same width, area, or volume. For example, each of the plurality of second portions 200b may have the same size (for example, the same width, area, or volume) within a process error range (or an allowable error) occurring in a manufacturing process. The first width W1 may be the same as or different from the second width W2. For example, the first width W1 may be greater than the second width W2. For example, the first portion 200a and the second portion 200b may include a line shape or a stripe shape which has the same size or different sizes. Therefore, the vibration portion PCL illustrated in FIG. 5A may include a 2-2 composite structure and thus may have a resonance frequency of 20 kHz or less, but aspects of the present disclosure are not limited thereto and a resonance frequency of the vibration portion PCL may vary based on at least one or more of a shape, a length, and a thickness of the vibration portion.

Figure 5B:
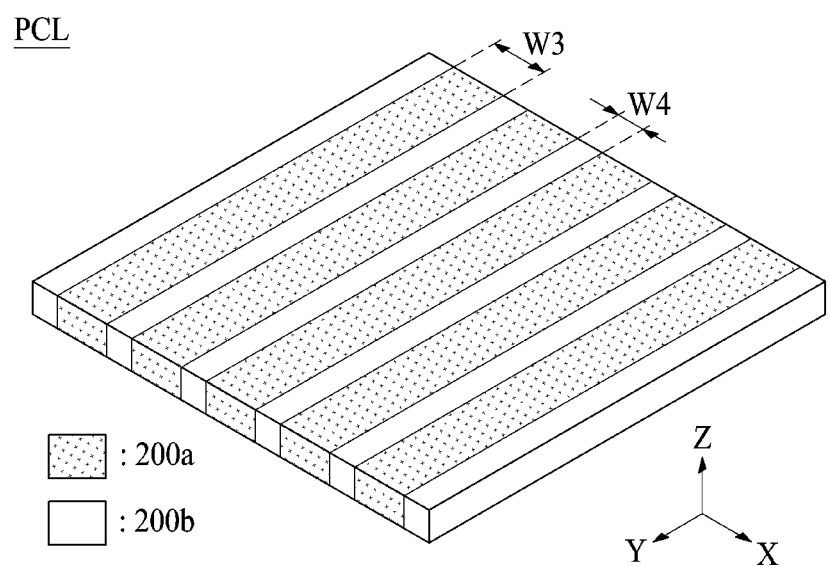

With reference to FIGS. 3, 4, and 5B, a vibration portion PCL of the vibration apparatus 200 according to another aspect of the present disclosure may include a plurality of first portions 200a and a plurality of second portions 200b, which are alternately and repeatedly arranged in a first direction X. Each of the plurality of first portions 200a may be disposed between two adjacent second portions 200b of the plurality of second portions 200b. For example, each of the plurality of first portions 200a may have a third width W3 parallel to the first direction X and a length parallel to a second direction Y. Each of the plurality of second portions 200b may have a fourth width W4 parallel to the first direction X and may have a length parallel to the second direction Y. The third width W3 may be the same as or different from the fourth width W4. For example, the third width W3 may be greater than the fourth width W4. For example, the first portion 200a and the second portion 200b may include a line shape or a stripe shape which has the same size or different sizes. Therefore, the vibration portion PCL illustrated in FIG. 5B may include a 2-2 composite structure and thus may have a resonance frequency of 20 kHz or less, but aspects of the present disclosure are not limited thereto and a resonance frequency of the vibration portion PCL may vary based on at least one or more of a shape, a length, and a thickness of the vibration portion.

In the vibration portion PCL illustrated in each of FIGS. 5A and 5B, each of the plurality of first portions 200a and each of the plurality of second portions 200b may be disposed (or arranged) in parallel on the same plane (or the same layer). Each of the plurality of second portions 200b may be configured to fill a gap between two adjacent first portions 200a. Each of the plurality of second portions 200b may be connected to or attached at an adjacent first portion 200a. Accordingly, the vibration portion PCL may be enlarged to have a desired size or length based on side coupling (or side connection) between the first portion 200a and the second portion 200b.

In the vibration portion (or vibration layer) PCL illustrated in each of FIGS. 5A and 5B, a width (or a size) W2 and W4 of each of the plurality of second portions 200b may progressively decrease in a direction from a center portion to both peripheries (or both sides or both ends) of the vibration portion PCL or the vibration apparatus 200.

According to another aspect of the present disclosure, a second portion 200b, having a largest width W2 and W4 of the plurality of second portions 200b, may be located at a portion on which a highest stress may concentrate when the vibration portion PCL or the vibration apparatus 200 is vibrating in a vertical (or upper and lower) direction Z (or a thickness direction). A second portion 200b, having a smallest width W2 and W4 of the plurality of second portions 200b, may be located at a portion where a relatively low stress may occur when the vibration portion PCL or the vibration apparatus 200 is vibrating in the vertical direction Z. For example, the second portion 200b, having the largest width W2 and W4 of the plurality of second portions 200b, may be disposed at the center portion of the vibration portion PCL, and the second portion 200b, having the smallest width W2 and W4 of the plurality of second portions 200b may be disposed at each of the both peripheries of the vibration portion PCL. Therefore, when the vibration portion PCL or the vibration apparatus 200 is vibrating in the vertical direction Z, interference of a sound wave or overlapping of a resonance frequency, each occurring in the portion on which the highest stress concentrates, may be reduced or minimized. Thus, dipping phenomenon of a sound pressure level occurring in the low-pitched sound band may be reduced, thereby improving flatness of a sound characteristic in the low-pitched sound band. For example, flatness of a sound characteristic may be a level of a deviation between a highest sound pressure and a lowest sound pressure.

In the vibration portion PCL illustrated in each of FIGS. 5A and 5B, each of the plurality of first portions 200a may have different sizes (or widths). For example, a size (or a width) of each of the plurality of first portions 200a may progressively decrease or increase in a direction from the center portion to the both peripheries (or both sides or both ends) of the vibration portion PCL or the vibration apparatus 200. In this case, in the vibration portion PCL, a sound pressure level characteristic of a sound may be enhanced and a sound reproduction band may increase, based on various natural vibration frequencies according to a vibration of each of the plurality of first portions 200a having different sizes.

Figure 5C:
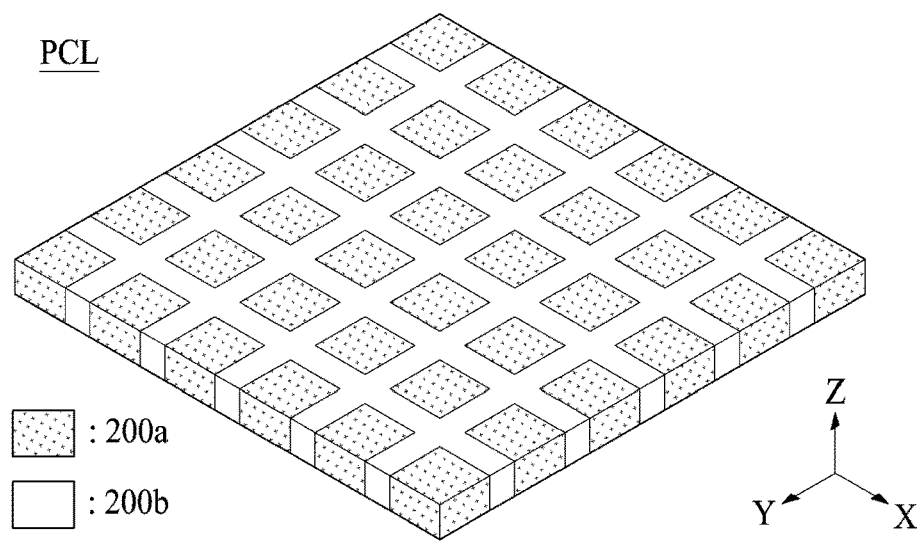

With reference to FIGS. 3, 4, and 5C, a vibration portion PCL of the vibration apparatus 200 according to another aspect of the present disclosure may include a plurality of first portions 200a, which are spaced apart from one another in a first direction X and a second direction Y, and a second portion 200b disposed between the plurality of first portions 200a. The plurality of first portions 200a may be disposed to be spaced apart from one another in the first direction X and the second direction Y. For example, each of the plurality of first portions 200a may have a hexahedral shape (or a six-sided member shape) having the same size and may be disposed in a lattice shape. The second portion 200b may be disposed between the plurality of first portions 200a in each of the first direction X and the second direction Y. The second portion 200b may be configured to fill a gap or a space between two adjacent first portions 200a or to surround each of the plurality of first portions 200a. Thus, the second portion 200b may be connected to or attached to an adjacent first portion 200a. For example, a width of a second portion 200b disposed between two first portions 200a adjacent to each other in the first direction X may be the same as or different from the first portion 200a, and a width of a second portion 200b disposed between two first portions 200a adjacent to each other in the second direction Y may be the same as or different from the first portion 200a. Therefore, the vibration portion PCL illustrated in FIG. 5C may have a resonance frequency of 30 MHz or less according to a 1-3 composite structure, but aspects of the present disclosure are not limited thereto and a resonance frequency of the vibration portion PCL may vary based on at least one or more of a shape, a length, and a thickness of the vibration portion.

Figure 5D:
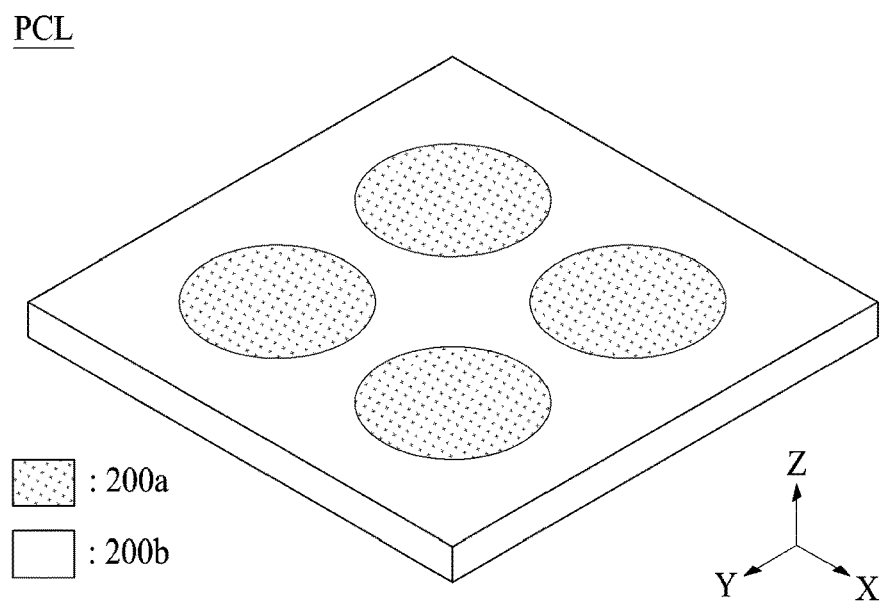

With reference to FIGS. 3, 4, and 5D, a vibration portion PCL of the vibration apparatus 200 according to another aspect of the present disclosure may include a plurality of first portions 200a, which are spaced apart from one another in a first direction X and a second direction Y, and a second portion 200b which surrounds each of the plurality of first portions 200a. Each of the plurality of first portions 200a may have a flat structure of a circular shape. For example, each of the plurality of first portions 200a may have a circular shape, but aspects of the present disclosure are not limited thereto and may have a dot shape including an oval shape, a polygonal shape, or a donut shape. The second portion 200b may be configured to surround each of the plurality of first portions 200a. Thus, the second portion 200b may be connected to or attached on a side surface of each of the plurality of first portions 200a. The plurality of first portions 200a and the second portion 200b may be disposed (or arranged) in parallel on the same plane (or the same layer). Therefore, the vibration portion PCL illustrated in FIG. 5D may include a 1-3 composite structure and may be implemented as a circular vibration source (or vibrator), and thus, may be enhanced in vibration characteristic or sound output characteristic and may have a resonance frequency of 30 MHz or less, but aspects of the present disclosure are not limited thereto and a resonance frequency of the vibration portion PCL may vary based on at least one or more of a shape, a length, and a thickness of the vibration portion.

Figure 5E:
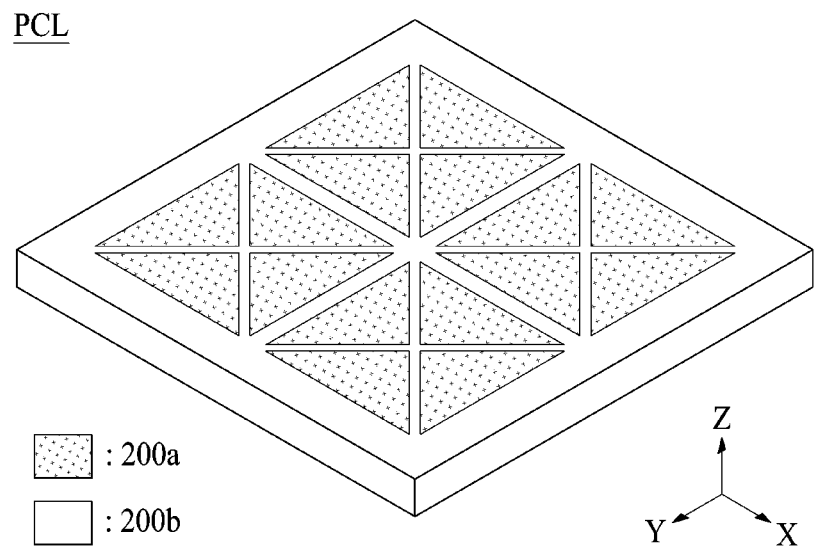

With reference to FIGS. 3, 4, and 5E, a vibration portion PCL of the vibration apparatus 200 according to another aspect of the present disclosure may include a plurality of first portions 200a, which are spaced apart from one another in a first direction X and a second direction Y, and a second portion 200b which surrounds each of the plurality of first portions 200a. Each of the plurality of first portions 200a may have a flat structure of a triangular shape. For example, each of the plurality of first portions 200a may have a triangular plate shape.

According to an aspect of the present disclosure, four adjacent first portions 200a of the plurality of first portions 200a may be adjacent to one another to form a tetragonal or quadrilateral shape (or a square shape). Vertices of the four adjacent first portions 200a forming a tetragonal shape may be adjacent to one another in a center portion (or a central portion) of the tetragonal shape. The second portion 200b may be configured to surround each of the plurality of first portions 200a. Thus, the second portion 200b may be connected to or attached to a side surface (or a lateral surface) of each of the plurality of first portions 200a. The plurality of first portions 200a and the second portion 200b may be disposed (or arranged) in parallel on the same plane (or the same layer). Therefore, the vibration portion PCL illustrated in FIG. 5E may have a resonance frequency of 30 MHz or less according to a 1-3 composite structure, but aspects of the present disclosure are not limited thereto and a resonance frequency of the vibration portion PCL may vary based on at least one or more of a shape, a length, and a thickness of the vibration portion.

Figure 5F:
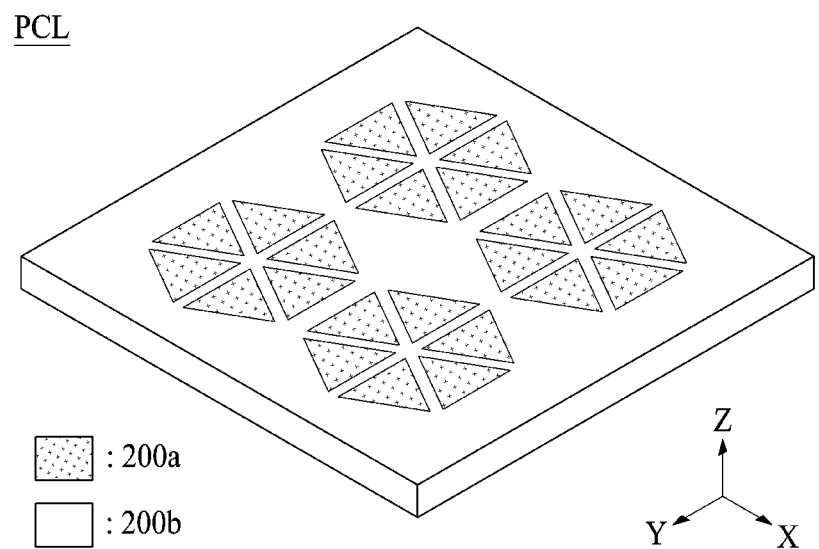

As another aspect of the present disclosure, as illustrated in FIG. 5F, six adjacent first portions 200a of the plurality of first portions 200a may be adjacent to one another to form a hexagonal shape (or a regularly hexagonal shape). Vertices of the six adjacent first portions 200a forming a hexagonal shape may be adjacent to one another in a center portion (or a central portion) of the hexagonal shape. The second portion 200b may be configured to surround each of the plurality of first portions 200a. Thus, the second portion 200b may be connected to or attached on a side surface (or a lateral surface) of each of the plurality of first portions 200a. The plurality of first portions 200a and the second portion 200b may be disposed (or arranged) in parallel on the same plane (or the same layer). Therefore, the vibration portion PCL illustrated in FIG. 5F may include a 1-3 composite structure and may be implemented as a circular vibration source (or vibrator), and thus, may be enhanced in vibration characteristic or sound output characteristic and may have a resonance frequency of 30 MHz or less, but aspects of the present disclosure are not limited thereto, and a resonance frequency of the vibration portion PCL may vary based on at least one or more of a shape, a length, and a thickness of the vibration portion.

With reference to FIGS. 5E and 5F, 2N (where N is a natural number greater than or equal to 2) adjacent first portions 200a of the plurality of first portions 200a having the triangular shape may be disposed adjacent to one another to form a 2N-angular shape.

In FIGS. 5A to 5F, the plurality of first portions 200a according to another aspect of the present disclosure may each be configured as an inorganic material portion. The inorganic material portion may include a piezoelectric material or an electroactive material. The piezoelectric material or the electroactive material may have a characteristic in which, when pressure or twisting (or bending) is applied to a crystalline structure by an external force, a potential difference occurs due to dielectric polarization caused by a relative position change of a positive (+) ion and a negative (−) ion, and a vibration is generated by an electric field based on a reverse voltage applied thereto. As described above with reference to FIG. 4, a first surface of each of the plurality of first portions 200a may be electrically connected to the first electrode layer E1, and a second surface of each of the plurality of first portions 200a may be electrically connected to the second electrode layer E2.

In FIGS. 5A to 5F, the inorganic material portion included in each of the plurality of first portions 200a may include a ceramic-based material for generating a relatively high vibration, or may include a piezoelectric ceramic having a perovskite-based crystalline structure. The perovskite crystalline structure may have a piezoelectric effect and an inverse piezoelectric effect, and may be a plate-shaped structure having orientation. The perovskite crystalline structure may be represented by a chemical formula "$ABO_3$". In the chemical formula, "A" may include a divalent metal element, and "B" may include a tetravalent metal element. For example, in the chemical formula "$ABO_3$", "A", and "B" may be cations, and "O" may be anions. For example, the first portions 200a may include one of lead (II) titanate ($PbTiO_3$), lead zirconate ($PbZrO_3$), lead zirconate titanate ($PbZrTiO_3$), barium titanate ($BaTiO_3$), and strontium titanate ($SrTiO_3$), but aspects of the present disclosure are not limited thereto.

When the perovskite crystalline structure includes a center ion (for example, lead (II) titanate ($PbTiO_3$)), a position of a titanium (Ti) ion may be changed by an external stress or a magnetic field, and thus, polarization may be changed, thereby generating a piezoelectric effect. For example, in the perovskite crystalline structure, a cubic shape corresponding to a symmetric structure may be changed to a tetragonal (or quadrilateral), orthorhombic, or rhombohedral structure corresponding to an unsymmetric structure, and thus, a piezoelectric effect may be generated. In a tetragonal (or quadrilateral), orthorhombic, or rhombohedral structure corresponding to an unsymmetric structure, polarization may be high in a morphotropic phase boundary, and realignment of polarization may be easy, whereby the perovskite crystalline structure may have a high piezoelectric characteristic.

According to an aspect of the present disclosure, the inorganic material portion included in each of the plurality of first portions 200a may include one or more materials of lead (Pb), zirconium (Zr), titanium (Ti), zinc (Zn), nickel (Ni), and niobium (Nb), but aspects of the present disclosure are not limited thereto.

According to another aspect of the present disclosure, the inorganic material portion included in each of the plurality of first portions 200a may include a lead zirconate titanate (PZT)-based material, including lead (Pb), zirconium (Zr), and titanium (Ti); or may include a lead zirconate nickel niobate (PZNN)-based material, including lead (Pb), zirconium (Zr), nickel (Ni), and niobium (Nb), but aspects of the present disclosure are not limited thereto. Also, the inorganic material portion may include at least one or more of calcium titanate ($CaTiO_3$), barium titanate ($BaTiO_3$), and strontium titanate ($SrTiO_3$), each without Pb, but aspects of the present disclosure are not limited thereto.

According to another aspect of the present disclosure, an inorganic material portion included in each of the plurality of first portions 200a may have a piezoelectric deformation coefficient "$d_{33}$" of 1,000 pC/N or more in a thickness direction Z. The vibration apparatus may be applied to a target object having a large size and may need to have a high piezoelectric deformation coefficient "$d_{33}$", for having a sufficient vibration characteristic or piezoelectric characteristic. For example, in order to have the high piezoelectric deformation coefficient "$d_{33}$", the inorganic material portion may include a PZT-based material ($PbZrTiO_3$) as a main component and may include a softener dopant material doped into A site (Pb) and a relaxor ferroelectric material doped into B site (ZrTi).

The softener dopant material may enhance a piezoelectric characteristic and a dielectric characteristic of the inorganic material portion, and for example, may increase the piezoelectric deformation coefficient "$d_{33}$" of the inorganic material portion. The softener dopant material according to an aspect of the present disclosure may include a dyad element "+2" to a triad element "+3". Morphotropic phase boundary (MPB) may be implemented by adding the softener dopant material to the PZT-based material ($PbZrTiO_3$), and thus, a piezoelectric characteristic and a dielectric characteristic may be enhanced. For example, the softener dopant material may include strontium (Sr), barium (Ba), lanthanum (La), neodymium (Nd), calcium (Ca), yttrium (Y), erbium (Er), or ytterbium (Yb). For example, ions ($Sr^{2+}$, $Ba^{2+}$, $La^{2+}$, $Nd^{3+}$, $Ca^{2+}$, $Y^{3+}$, $Er^{3+}$, $Yb^{3+}$) of the softener dopant material doped into the PZT-based material ($PbZrTiO_3$) may substitute a portion of lead (Pb) in the PZT-based material ($PbZrTiO_3$), and a substitution rate thereof may be about 2 mol % to about 20 mol %. For example, when the substitution rate is smaller than 2 mol % or greater than 20 mol %, a perovskite crystal structure may be broken, and thus, an electromechanical coupling coefficient "kP" and the piezoelectric deformation coefficient "$d_{33}$" may decrease. When the softener dopant material is substituted, the MPB may be formed, and a piezoelectric characteristic and a dielectric characteristic may be high in the MPB, thereby implementing a vibration apparatus having a high piezoelectric characteristic and a high dielectric characteristic.

According to an aspect of the present disclosure, the relaxor ferroelectric material doped into the PZT-based material ($PbZrTiO_3$) may enhance an electric deformation characteristic of the inorganic material portion. The relaxor ferroelectric material according to an aspect of the present disclosure may include a lead magnesium niobate (PMN)-based material or a lead nickel niobate (PNN)-based material, but aspects of the present disclosure are not limited thereto. The PMN-based material may include Pb, Mg, and Nb, and for example, may include $Pb(Mg, Nb)O_3$. The PNN-based material may include Pb, Ni, and Nb, and for example, may include $Pb(Ni, Nb)O_3$. For example, the relaxor ferroelectric material doped into the PZT-based material ($PbZrTiO_3$) may substitute a portion of each of zirconium (Zr) and titanium (Ti) in the PZT-based material ($PbZrTiO_3$), and a substitution rate thereof may be about 5 mol % to about 25 mol %. For example, when the substitution rate is smaller than 5 mol % or greater than 25 mol %, a perovskite crystal structure may be broken, and thus, the electromechanical coupling coefficient "kP" and the piezoelectric deformation coefficient "$d_{33}$" may decrease.

According to an aspect of the present disclosure, the inorganic material portion provided in each of the plurality of first portions 211 may further include a donor material doped into B site (ZrTi) of the PZT-based material (PbZrTiO$_3$), in order to more enhance a piezoelectric coefficient. For example, the donor material doped into the B site (ZrTi) may include a tetrad element "+4" or a hexad element "+6". For example, the donor material doped into the B site (ZrTi) may include tellurium (Te), germanium (Ge), uranium (U), bismuth (Bi), niobium (Nb), tantalum (Ta), antimony (Sb), or tungsten (W).

The inorganic material portion configured in each of the plurality of first portions 200a according to an aspect of the present disclosure may have a piezoelectric deformation coefficient "$d_{33}$" of 1,000 pC/N or more in a thickness direction Z, thereby implementing a vibration apparatus having an enhanced vibration characteristic. For example, a vibration apparatus 200 having an enhanced vibration characteristic may be implemented in a vibration member (or a vibration object) having a large-area.

In FIGS. 5A to 5F, the second portion 200b may be disposed between the plurality of first portions 200a, or may be disposed to surround each of the plurality of first portions 200a. Therefore, in the vibration portion PCL or the vibration apparatus 200, vibration energy based on a link in a unit lattice of each first portion 200a may increase by a corresponding second portion 200b. Thus, a vibration may increase, and a piezoelectric characteristic and flexibility may be secured. For example, the second portion 200b may include one of an epoxy-based polymer, an acrylic-based polymer, and a silicone-based polymer, but aspects of the present disclosure are not limited thereto.

The second portion 200b according to an aspect of the present disclosure may be configured with an organic material portion. For example, the organic material portion may be disposed between the inorganic material portions and may absorb an impact applied to the inorganic material portion (or the first portion), may release a stress concentrating on the inorganic material portion to enhance the total durability of the vibration portion PCL or the vibration apparatus 200, and may provide flexibility to the vibration portion PCL or the vibration apparatus 200.

The second portion 200b according to an aspect of the present disclosure may have modulus and viscoelasticity that are lower than those of each first portion 200a. Thus, the second portion 200b may enhance the reliability of each first portion 200a vulnerable to an impact due to a fragile characteristic. For example, the second portion 200b may include a material having a loss coefficient of about 0.01 to about 1.0 and modulus of about 0.1 [GPa] to about 10 [GPa].

The organic material portion configured in the second portion 200b may include one or more of an organic material, an organic polymer, an organic piezoelectric material, and an organic non-piezoelectric material that has a flexible characteristic or a ductile characteristic in comparison with the inorganic material portion of the first portions 200a. For example, the second portion 200b may be referred to as an adhesive portion, a stretch portion, a bending portion, a damping portion, or a flexible portion, or the like, but aspects of the present disclosure are not limited thereto.

Therefore, the plurality of first portions 200a and the second portion 200b may be disposed at (or connected to) the same plane, and thus, the vibration portion PCL of the vibration apparatus 200 according to various aspects of the present disclosure may have a single thin film-type. For example, the vibration portion PCL may be vibrated in a vertical (or upper and lower) direction by the first portion 200a having a vibration characteristic and may be bent in a curved shape by the second portion 200b having flexibility or ductility. Also, in the vibration portion PCL of the vibration apparatus 200 according to various aspects of the present disclosure, a size of the first portion 200a and a size of the second portion 200b may be adjusted based on a piezoelectric characteristic and flexibility needed for the vibration portion PCL. For example, in a case where the vibration portion PCL needs a piezoelectric characteristic rather than flexibility, a size of the first portion 200a may be configured to be greater than the second portion 200b. As another aspect of the present disclosure, in a case where the vibration portion PCL needs flexibility rather than a piezoelectric characteristic, a size of the second portion 200b may be configured to be greater than the first portion 200a. Accordingly, a size of the vibration portion PCL may be adjusted based on a characteristic needed therefor, and thus, the vibration portion PCL may be easy to design.

One or more of the vibration portions PCL illustrated in FIGS. 5A to 5F may be the vibration portion PCL of the vibration apparatus 200 illustrated in FIG. 3. For example, the vibration portion PCL may be implemented with one or more of the vibration portion PCL described above with reference to FIGS. 5A to 5F, based on a desired characteristic of a sound generated based on a vibration of the vibration apparatus 200.

According to an aspect of the present disclosure, the vibration apparatus 200 may include one or more of the vibration portions PCL described above with reference to FIGS. 5A to 5F.

According to an aspect of the present disclosure, the vibration apparatus 200 may be configured with a piezoelectric element. The piezoelectric element may be configured with a piezoelectric ceramic. For example, the piezoelectric element may alternately and/or repeatedly contract and expand based on a piezoelectric effect or an inverse piezoelectric effect to vibrate. For example, the piezoelectric element may be configured with a lead zirconate titanate (PZT)-based material or barium titanate (BaTiO$_3$), but aspects of the present disclosure are not limited thereto.

Figure 6:
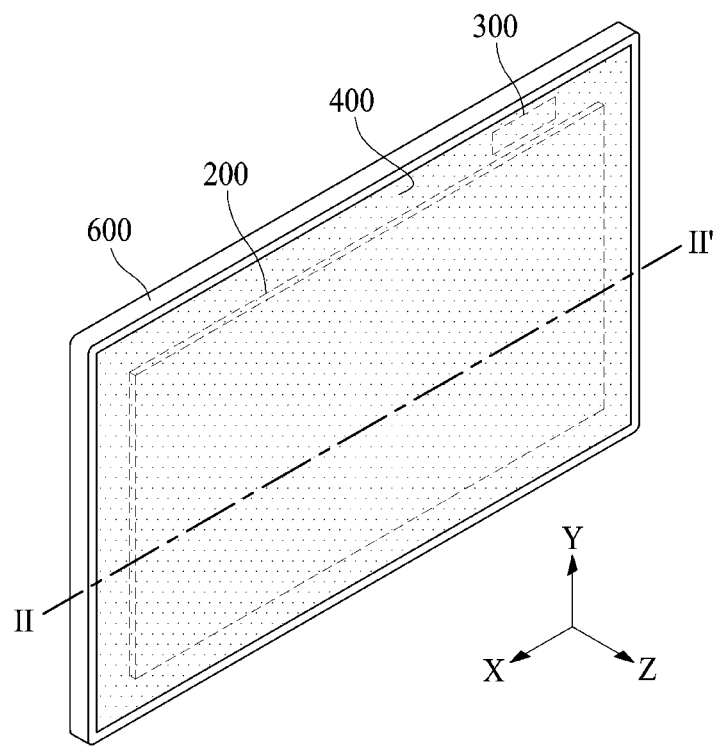
FIG. 6 illustrates an apparatus according to an aspect of the present disclosure.
Figure 7:
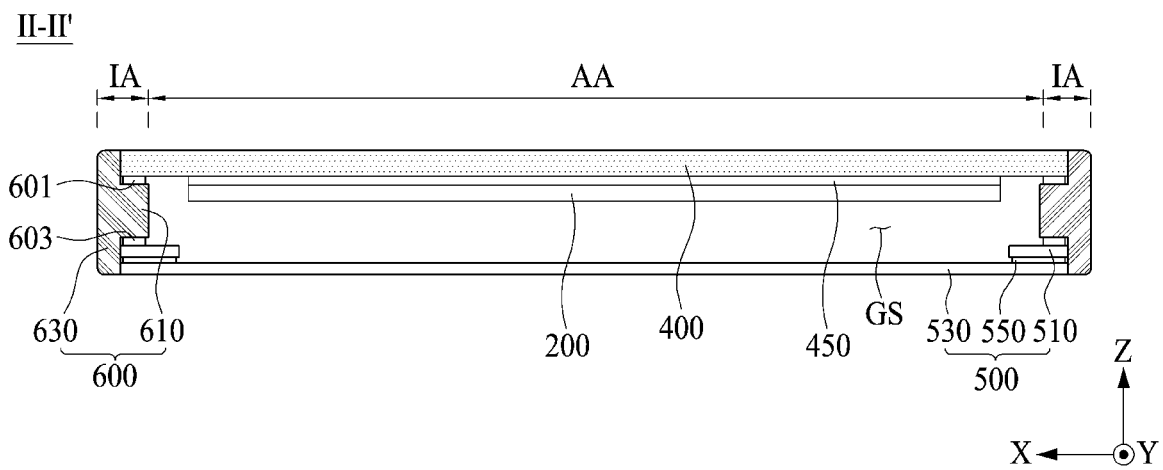
FIG. 7 is a cross-sectional view taken along line II-IF illustrated in FIG. 6.

FIG. 6 illustrates an apparatus according to an aspect of the present disclosure. FIG. 7 is a cross-sectional view taken along line II-IF illustrated in FIG. 6.

With reference to FIGS. 6 and 7, an apparatus according to an aspect of the present disclosure may include a display panel 400 to display an image, and a vibration apparatus 200 disposed at a rear surface (or a backside surface) of the display panel 400.

The vibration apparatus 200 of the apparatus according to an aspect of the present disclosure may be the vibration apparatus 200 described with reference to FIG. 1, thus, their repetitive descriptions of the vibration apparatus 200 and elements relevant thereto are omitted or will be briefly given. For example, the vibration apparatus 200 may be disposed into the apparatus and may be implemented at a flexible printed circuit board.

The vibration apparatus 200 of the apparatus according to an aspect of the present disclosure may be the vibration apparatus 200 described with reference to FIGS. 1 to 5F, thus, their repetitive descriptions of the vibration apparatus 200 and elements relevant thereto are omitted.

The display panel 400 may be configured to display an electronic image or a digital image. For example, the display panel 400 may output light to display an image. The display panel 400 may be a curved display panel, or may be any type of display panel, such as a liquid crystal display panel, an organic light-emitting display panel, a quantum dot light-emitting display panel, a micro light-emitting diode display panel, and an electrophoresis display panel. The display panel 400 may be a flexible display panel. For example, the display panel 400 may a flexible light emitting display panel, a flexible electrophoretic display panel, a flexible electro-wetting display panel, a flexible micro light emitting diode display panel, or a flexible quantum dot light emitting display panel, but aspects of the present disclosure are not limited thereto.

The display panel 400 according to an aspect of the present disclosure may include a display area AA configured to display an image according to driving of the plurality of pixels. The display panel 400 may include a non-display area IA surrounding the display area AA, but aspect of the present disclosure is not limited thereto.

The display panel 400 according to an aspect of the present disclosure may be configured to display an image in a type such as a top emission type, a bottom emission type, a dual emission type, or the like according to a structure of the pixel array layer including an anode electrode, a cathode electrode, and a light emitting device. In the top emission type, an image may be displayed by outputting visible light generated from the pixel array layer to the forward region of a base substrate. In the bottom emission type, an image may be displayed by outputting visible light generated from the pixel array layer to the backward region of the base substrate.

The display panel 400 according to an aspect of the present disclosure may include a pixel array part disposed in a pixel area configured by a plurality of gate lines and/or a plurality of data lines. The pixel array part may include a plurality of pixels which display an image based on a signal supplied through the signal lines. The signal lines may include a gate line, a data line, a pixel driving power line, and/or the like, but aspects of the present disclosure are not limited thereto.

Each of the plurality of pixels may include a pixel circuit layer including a driving thin film transistor (TFT) provided at the pixel area, an anode electrode electrically connected to the driving TFT, a light emitting device formed over the anode electrode, and a cathode electrode electrically connected to the light emitting device.

The driving TFT may be configured at a transistor region of each pixel area provided at a substrate. The driving TFT may include a gate electrode, a gate insulation layer, a semiconductor layer, a source electrode, and a drain electrode. The semiconductor layer of the driving TFT may include silicon such as amorphous silicon (a-Si), polysilicon (poly-Si), and low temperature poly-Si or may include oxide such as indium-gallium-zinc-oxide (IGZO), but aspects of the present disclosure are not limited thereto.

The anode electrode may be provided at an opening region provided at each pixel area and may be electrically connected to the driving TFT.

A light emitting device according to an aspect may include an organic light emitting device layer formed over an anode electrode. The organic light emitting device layer may be implemented to emit light having the same color (for example, white light) for each pixel, or may be implemented to emit light having a different color (for example, red light, green light, or blue light) for each pixel. A cathode electrode (or a common electrode) may be connected to the organic light emitting device layer provided in each pixel area in common. For example, the organic light emitting device layer may have a stack structure including a single structure or two or more structures including the same color for each pixel. As another aspect of the present disclosure, the organic light emitting device layer may have a stack structure including two or more structures including one or more different colors for each pixel. The two or more structures including the one or more different colors may be configured with one or more of blue, red, yellow-green, and green or a combination thereof, but aspects of the present disclosure are not limited thereto. An aspect of the combination may include blue and red, red and yellow-green, red and green, red/yellow-green/green, or the like, but aspects of the present disclosure are not limited thereto. Also, regardless of a stack order thereof, the present disclosure may be applied. The stack structure including two or more structures having the same color or one or more different colors may further include a charge generating layer between the two or more structures. The charge generating layer may have a PN junction structure and may include an N-type charge generating layer and a P-type charge generating layer.

The light emitting device according to another aspect of the present disclosure may include a micro light emitting diode device electrically connected to each of an anode electrode and a cathode electrode. The micro light emitting diode device may be a light emitting diode implemented as an integrated circuit (IC) or chip type. The micro light emitting diode device may include a first terminal electrically connected to the anode electrode and a second terminal electrically connected to the cathode electrode. The cathode electrode may be connected to the second terminal of the micro light emitting diode device provided in each pixel area in common.

An encapsulation part may be formed over the substrate to surround the pixel array part, thereby preventing oxygen or water from penetrating into the light emitting device of the pixel array part. The encapsulation part according to an aspect of the present disclosure may be formed in a multi-layer structure where an organic material layer and an inorganic material layer are alternately stacked, but aspect of the present disclosure is not limited thereto. The inorganic material layer may prevent oxygen or water from penetrating into the light emitting device of the pixel array part. The organic material layer may be formed to have a thickness which is relatively thicker than the inorganic material layer, so as to cover particles occurring in a manufacturing process. For example, the encapsulation part may include a first inorganic layer, an organic layer over the first inorganic layer, and a second inorganic layer over the organic layer. The organic layer may be a particle cover layer, but aspects of the present disclosure are not limited thereto. The touch panel may be disposed over the encapsulation part, or may be disposed at a rear surface of the pixel array part.

The display panel 400 according to an aspect of the present disclosure may include a first substrate, a second substrate, and a liquid crystal layer. The first substrate may be an upper substrate or a thin film transistor (TFT) array substrate. For example, the first substrate may include a pixel array (or a display part or a display area) including a plurality of pixels which are respectively provided in a plurality of pixel areas defined by intersections between a plurality of gate lines and/or a plurality of data lines. Each of the plurality of pixels may include a TFT connected to a gate line and/or a data line, a pixel electrode connected to the TFT, and a common electrode which is provided adjacent to the pixel electrode and is supplied with a common voltage.

The first substrate may further include a pad part provided at a first periphery (or a first non-display part) and a gate driving circuit provided at a second periphery (or a second non-display part).

The pad part may supply a signal, supplied from the outside, to the pixel array and/or the gate driving circuit. For example, the pad part may include a plurality of data pads connected to a plurality of data lines through a plurality of data link lines and/or a plurality of gate input pads connected to the gate driving circuit through a gate control signal line. For example, a size of the first substrate may be greater than the second substrate, but aspects of the present disclosure are not limited thereto.

The gate driving circuit according to an aspect of the present disclosure may be embedded (or integrated) into a second periphery of the first substrate so as to be connected to the plurality of gate lines. For example, the gate driving circuit may be implemented with a shift register including a transistor, which is formed through the same process as the TFT provided at the pixel area. The gate driving circuit according to another aspect of the present disclosure may be implemented as an integrated circuit (IC) and may be provided at a panel driving circuit without being embedded into the first substrate.

The second substrate may be a lower substrate or a color filter array substrate. For example, the second substrate may include a pixel defining layer configured to include an opening area overlapping with the pixel area formed at the first substrate, and a color filter layer formed at the opening area. The second substrate may have a size which is smaller than the first substrate, but aspects of the present disclosure are not limited thereto. For example, the second substrate may overlap a remaining portion, other than the first periphery, of the first substrate (i.e., the upper substrate). The second substrate may be bonded to a remaining portion, other than the first periphery, of the first substrate with a liquid crystal layer therebetween using a sealant.

The liquid crystal layer may be disposed between the first substrate and the second substrate. The liquid crystal layer may include a liquid crystal including liquid crystal molecules where an alignment direction thereof is changed based on an electric field generated by the common voltage and a data voltage applied to a pixel electrode for each pixel.

A first polarization member may be attached at an upper surface of the first substrate and may polarize light which passes through the first substrate and is output to the outside. A second polarization member may be attached at a lower surface of the second substrate and may polarize light which is incident from the backlight and travels to the liquid crystal layer.

The display panel 400 according to an aspect of the present disclosure may drive the liquid crystal layer based on an electric field which is generated in each pixel by the data voltage and the common voltage applied to each pixel, and thus, may display an image based on light passing through the liquid crystal layer.

In display panel 400 according to another aspect of the present disclosure, the first substrate may be implemented with the color filter array substrate, and the second substrate may be implemented with the TFT array substrate. For example, the display panel 400 according to another aspect of the present disclosure may have a type where an upper portion and a lower portion of the display panel 400 according to an aspect of the present disclosure are reversed therebetween. For example, a pad part of the display panel 400 according to another aspect of the present disclosure may be covered by a separate mechanism or structure.

The display panel 400 according to another aspect of the present disclosure may include a bending portion that may be bent or curved to have a curved shape or a certain curvature radius.

The bending portion of the display panel 400 may be in at least one of one periphery and the other periphery of the display panel 400, which are parallel to each other. The one periphery and/or the other periphery, where the bending portion is implemented, of the display panel 400 may include only the non-display area IA, or may include a periphery of the display area AA and the non-display area IA. The display panel 400 including the bending portion implemented by bending of the non-display area IA may have a one-side bezel bending structure or a both-side bezel bending structure. Moreover, the display panel 400 including the bending portion implemented by bending of the periphery of the display area AA and the non-display area IA may have a one-side active bending structure or a both-side active bending structure.

The vibration apparatus 200 may vibrate the display panel 400. For example, the vibration apparatus 200 may vibrate the display panel 400 based on a driving signal (or a voice signal or a sound signal) provided from a vibration driving circuit. For example, the vibration apparatus 200 may vibrate the display panel 400 based on the driving signal provided from the vibration driving circuit 100 illustrated in FIG. 1. For example, the vibration apparatus 200 may be implemented at the rear surface of the display panel 400 to directly vibrate the display panel 400. For example, the vibration apparatus 200 may vibrate the display panel 400 at the rear surface of the display panel 400, thereby providing a sound and/or a haptic feedback based on the vibration of the display panel 400 to a user (or a viewer).

According to an aspect of the present disclosure, the vibration apparatus 200 may vibrate according to a driving signal synchronized with an image displayed by the display panel 400 to vibrate the display panel 400. As another aspect of the present disclosure, the vibration apparatus 200 may vibrate according to a haptic feedback signal (or a tactile feedback signal) synchronized with a user touch applied to a touch panel (or a touch sensor layer) which is disposed over the display panel 400 or embedded into the display panel 400 and may vibrate the display panel 400. Accordingly, the display panel 400 may vibrate based on a vibration of the vibration apparatus 200 to provide a user (or a viewer) with at least one or more of a sound and a haptic feedback.

The vibration apparatus 200 according to an aspect of the present disclosure may be implemented to have a size corresponding to the display area AA of the display panel 400. A size of the vibration apparatus 200 may be 0.9 to 1.1 times a size of the display area AA, but aspects of the present disclosure are not limited thereto. For example, a size of the vibration apparatus 200 may be the same as or smaller than the size of the display area AA. For example, a size of the vibration apparatus 200 may be the same as or approximately same as the display area AA of the display panel 400, and thus, the vibration apparatus 200 may cover a most region of the display panel 400 and a vibration generated by the vibration apparatus 200 may vibrate a whole portion of the display panel 400, and thus, localization of a sound may be high, and satisfaction of a user may be improved. Also, a contact area (or panel coverage) between the display panel 400 and the vibration apparatus 200 may increase, and thus, a vibration region of the display panel 400 may increase, thereby improving a sound of a middle-low-pitched sound band generated based on a vibration of the display panel 400. Also, a vibration apparatus 200 applied to a large-sized display apparatus may vibrate the entire display panel 400 having a large size (or a large area), and thus, localization of a sound based on a vibration of the display panel 400 may be further enhanced, thereby realizing an improved sound effect. Therefore, the vibration apparatus 200 according to an aspect of the present disclosure may be on the rear surface of the display panel 400 to sufficiently vibrate the display panel 400 in a vertical (or front-to-rear) direction, thereby outputting a desired sound to a forward region in front of the apparatus or the display apparatus.

The vibration apparatus 200 may be disposed at the rear surface of the display panel 400 to overlap the display area of the display panel 400. For example, the vibration apparatus 200 may overlap half or more of the display area of the display panel 400. As another aspect of the present disclosure, the vibration apparatus 200 may overlap the whole display area of the display panel 400.

The vibration apparatus 200 according to an aspect of the present disclosure may vibrate by alternately and repeatedly contract and expand based on an inverse piezoelectric effect when an alternating current (AC) voltage is applied, thereby vibrating the display panel 400 through the vibration thereof. For example, the vibration apparatus 200 may vibrate according to a voice signal synchronized with an image displayed by the display panel 400 to vibrate the display panel 400. As another aspect of the present disclosure, the vibration apparatus 200 may vibrate according to a haptic feedback signal (or a tactile feedback signal) synchronized with a user touch applied to a touch panel (or a touch sensor layer) which is disposed over the display panel 400 or embedded into the display panel 400 and may vibrate the display panel 400. Accordingly, the display panel 400 may vibrate based on a vibration of the vibration apparatus 200 to provide a user (or a viewer) with at least one or more of a sound and a haptic feedback.

Therefore, the apparatus according to an aspect of the present disclosure may output a sound, generated by a vibration of the display panel 400 based on a vibration of the vibration apparatus 200, in a forward region in front of the display panel. Moreover, in the apparatus according to an aspect of the present disclosure, a most region of the display panel 400 may be vibrated by the vibration apparatus 200 having a film-type, thereby more enhancing a sense of sound localization and a sound pressure level characteristic of a sound based on the vibration of the display panel 400.

The apparatus according to an aspect of the present disclosure may further include a connection member (or a first connection member) 450.

According to an aspect of the present disclosure, the connection member 450 may be disposed between a rear surface of the display panel 400 and the vibration apparatus 200, and may connect or couple the vibration apparatus 200 to the rear surface of the display panel 400. For example, the vibration apparatus 200 may be connected or coupled to the rear surface of the display panel 400 by the connection member 450, and thus, may be supported by or disposed at the rear surface of the display panel 400. For example, the vibration apparatus 200 may be disposed at the rear surface of the display panel 400 by the connection member 450.

The connection member 450 according to an aspect of the present disclosure may include may include a material including an adhesive layer which is good in adhesive force or attaching force with respect to each of the rear surface of the display panel 400 and the vibration apparatus 200. For example, the connection member 450 may include a foam pad, a double-sided tape, an adhesive, or the like, but aspects of the present disclosure are not limited thereto. For example, the adhesive layer of the connection member 450 may include epoxy, acrylic, silicone, or urethane, but aspects of the present disclosure are not limited thereto. For example, the adhesive layer of the connection member 450 may include an acrylic-based material which is relatively better in adhesive force and hardness of acrylic and urethane. Accordingly, a vibration of the vibration apparatus 200 may be transferred to the display panel 400 well.

The adhesive layer of the connection member 450 may further include an additive, such as a tackifier, an adhesion enhancing agent, a wax component, and an anti-oxidation agent, or the like. The additive may prevent or reduce the connection member 450 from being detached (stripped) from the display panel 400 by a vibration of the vibration apparatus 200. For example, the tackifier may be rosin derivative or the like, and the wax component may be paraffin wax or the like. For example, the anti-oxidation agent may be a phenol-based anti-oxidation agent, such as thioester, but aspects of the present disclosure are not limited thereto.

The connection member 450 according to another aspect of the present disclosure may further include a hollow portion between the display panel 400 and the vibration apparatus 200. The hollow portion of the connection member 450 may provide an air gap between the display panel 400 and the vibration apparatus 200. Due to the air gap, a sound wave (or a sound pressure) based on a vibration of the vibration apparatus 200 may not be dispersed by the connection member 450, and may concentrate on the display panel 400. Thus, the loss of a vibration caused by the connection member 450 may be minimized, thereby increasing a sound characteristic and/or a sound pressure level characteristic of a sound generated based on a vibration of the display panel 400.

The apparatus according to an embodiment of the present disclosure may further include a plate disposed between the display panel 400 and the vibration apparatus 200. The plate may be similar to plate 215, and may include a metal material, and for example, may include one or more materials of stainless steel, aluminum (Al), a magnesium (Mg), a magnesium (Mg) alloy, a magnesium-lithium (Mg—Li) alloy, and an Al alloy, but embodiments of the present disclosure are not limited thereto.

The apparatus according to an aspect of the present disclosure may further include a supporting member 500 disposed at a rear surface of the display panel 400.

The supporting member 500 may be disposed at the rear surface of the display panel 400. For example, the supporting member 500 may cover the rear surface of the display panel 400. For example, the supporting member 500 may cover a whole rear surface of the display panel 400 with a gap space GS therebetween. For example, the supporting member 500 may include at least one or more of a glass material, a metal material, and a plastic material. For example, the supporting member 500 may be a rear surface structure or a set structure. For example, the supporting member 500 may be referred to as the other term such as a cover bottom, a plate bottom, a back cover, a base frame, a metal frame, a metal chassis, a chassis base, m-chassis, or the like. For example, the supporting member 500 may be implemented as an arbitrary type frame or a plate-shaped structure disposed at the rear surface of the display panel 400.

A periphery or a sharp corner of the supporting member 500 may have an inclined shape or a curved shape through a chamfer process or a corner rounding process. For example, the supporting member 500 of the glass material may be sapphire glass. As another aspect of the present disclosure, the supporting member 500 of the metal material may include one or more of aluminum (Al), an Al alloy, a magnesium (Mg), a magnesium (Mg) alloy, and an iron (Fe)-nickel (Ni) alloy.

The supporting member 500 according to an aspect of the present disclosure may include a first supporting member 510 and a second supporting member 530.

The first supporting member 510 may be disposed between the rear surface of the display panel 400 and the second supporting member 530. For example, the first supporting member 510 may be disposed between a rear periphery portion of the display panel 400 and a front periphery portion of the second supporting member 530. The first supporting member 510 may support one or more of the rear periphery portion of the display panel 400 and the front periphery portion of the second supporting member 530. As another aspect of the present disclosure, the first supporting member 510 may cover the rear surface of the display panel 400. For example, the first supporting member 510 may cover a whole rear surface of the display panel 400. For example, the first supporting member 510 may be a member which covers a whole rear surface of the display panel 400. For example, the first supporting member 510 may include at least one or more materials of a glass material, a metal material, and a plastic material. For example, the first supporting member 510 may be an inner plate, but aspects of the present disclosure are not limited thereto. For example, the first supporting member 510 may be omitted.

The first supporting member 510 may be spaced apart from a rearmost surface of the display panel 400 or the vibration apparatus 200 with a gap space GS therebetween. For example, the gap space GS may be referred to as an air gap, a vibration space, a sound resonance box, or the like, but aspects of the present disclosure are not limited thereto.

The second supporting member 530 may be disposed at a rear surface of the first supporting member 510. The second supporting member 530 may be a member which covers the whole rear surface of the display panel 400. For example, the second supporting member 530 may include at least one or more of a glass material, a metal material, and a plastic material. For example, the second supporting member 530 may be an outer plate, a rear plate, a back plate, or a rear cover, but aspects of the present disclosure are not limited thereto.

The supporting member 500 according to an aspect of the present disclosure may further include a connection member (or a second connection member, or a coupling member) 550.

The connection member 550 may be disposed between the first supporting member 510 and the second supporting member 530. For example, the first supporting member 510 and the second supporting member 530 may be coupled or connected to each other by the connection member 550. For example, the connection member 550 may be an adhesive resin, a double-sided tape, or a double-sided adhesive foam pad, but aspects of the present disclosure are not limited thereto. For example, the connection member 550 may have elasticity for absorbing an impact, but aspects of the present disclosure are not limited thereto. For example, the connection member 550 may be disposed at a whole region between the first supporting member 510 and the second supporting member 530. As another aspect of the present disclosure, the connection member 550 may be provided in a mesh structure including an air gap between the first supporting member 510 and the second supporting member 530.

The apparatus according to an aspect of the present disclosure may further include a middle frame 600. The middle frame 600 may be disposed between a rear periphery portion of the display panel 400 and a front periphery portion of the supporting member 500. The middle frame 600 may support one or more of the rear periphery portion of the display panel 400 and the front periphery portion of the supporting member 500. The middle frame 600 may surround one or more of side surfaces of each of the display panel 400 and the supporting member 500. The middle frame 600 may provide a gap space GS between the display panel 400 and the supporting member 500. The middle frame 600 may be referred to as a middle cabinet, a middle cover, a middle chassis, or the like, but aspects of the present disclosure are not limited thereto.

The middle frame 600 according to an aspect of the present disclosure may include a first supporting portion 610 and a second supporting portion 630. For example, the first supporting portion 610 may be a supporting part, but aspects of the present disclosure are not limited thereto. For example, the second supporting portion 630 may be a sidewall part, but aspects of the present disclosure are not limited thereto.

The first supporting portion 610 may be disposed between the rear periphery of the display panel 400 and the front periphery of the supporting member 500, and thus, may provide a gap space GS between the display panel 400 and the supporting member 500. A front surface of the first supporting portion 610 may be coupled or connected to the rear periphery portion of the display panel 400 by a first connection member (or a first coupling member) 601. A rear surface of the first supporting portion 610 may be coupled or connected to the front periphery portion of the supporting member 500 by a second connection member (or a second coupling member) 603. For example, the first supporting portion 610 may have a single picture frame structure having a square shape or a frame structure having a plurality of divided bar shapes, but aspects of the present disclosure are not limited thereto.

The second supporting portion 630 may be disposed in parallel with a thickness direction Z of the apparatus. For example, the second supporting portion 630 may be vertically coupled to an outer surface of the first supporting portion 610 in parallel with a thickness direction Z of the apparatus. The second supporting portion 630 may surround one or more of an outer surface of the display panel 400 and an outer surface of the supporting member 500, thereby protecting the outer surface of each of the display panel 400 and the supporting member 500. The first supporting portion 610 may protrude from an inner surface of the second supporting portion 630 toward the gap space GS between the display panel 400 and the supporting member 500.

The apparatus according to an aspect of the present disclosure may include a panel connection member instead of the middle frame 600.

The panel connection member may be disposed between the rear periphery portion of the display panel 400 and the front periphery portion of the supporting member 500 and may provide the gap space GS between the display panel 400 and the supporting member 500. The panel connection member may be disposed between the rear periphery portion of the display panel 400 and the front periphery portion of the supporting member 500 to adhere the display panel 400 and the supporting member 500. For example, the panel connection member may be a double-sided tape, a single-sided tape, or a double-sided adhesive foam pad, but aspects of the present disclosure are not limited thereto. For example, the panel connection member may include epoxy, acrylic, silicone, or urethane, but aspects of the present disclosure are not limited thereto. For example, in order to minimize the vibration of the display panel 400 from being transmitted to the supporting member 500, an adhesive layer of the panel connection member may include a urethane-based material which relatively has a ductile characteristic compared to acrylic, among acrylic and urethane. Accordingly, a vibration of the display panel 400 transmitted to the supporting member 500 may be minimized.

In the apparatus according to an aspect of the present disclosure, when the apparatus includes a panel connection member instead of a middle frame 600, the supporting member 500 may include a bending sidewall which is bent from an end (or an end portion) of the second supporting member 530 and surrounds one or more of an outer surface (or an outer sidewall) of each of the first supporting member 510, the panel connection member, and the display panel 400. The bending sidewall according to an aspect of the present disclosure may have a single sidewall structure or a hemming structure. The hemming structure may be a structure where end portions of an arbitrary member are bent in a curve shape and overlap each other or are apart from each other in parallel. For example, in order to enhance a sense of beauty in design, the bending sidewall may include a first bending sidewall, bent from one side of the second supporting member 530, and a second bending sidewall bent from the first bending sidewall to a region between the first bending sidewall and an outer surface of the display panel 400. The second bending sidewall may be spaced apart from an inner surface of the first bending sidewall to minimize contact with the inner surface of the first bending sidewall or external impact in a lateral direction from being transmitted to the outer surface of the display panel 400. Therefore, the second bending sidewall may prevent the outer surface of the display panel 400 from contacting an inner surface of the first bending sidewall or may prevent a lateral direction external impact from being transferred to the outer surface of the display panel 400.

According to another aspect of the present disclosure, in the apparatus according to another aspect of the present disclosure, the middle frame 600 may be omitted. Instead of the middle frame 600, it may be configured with a panel connecting member or an adhesive. According to another aspect of the present disclosure, it may be configured with a partition instead of the middle frame 600.

Figure 8:
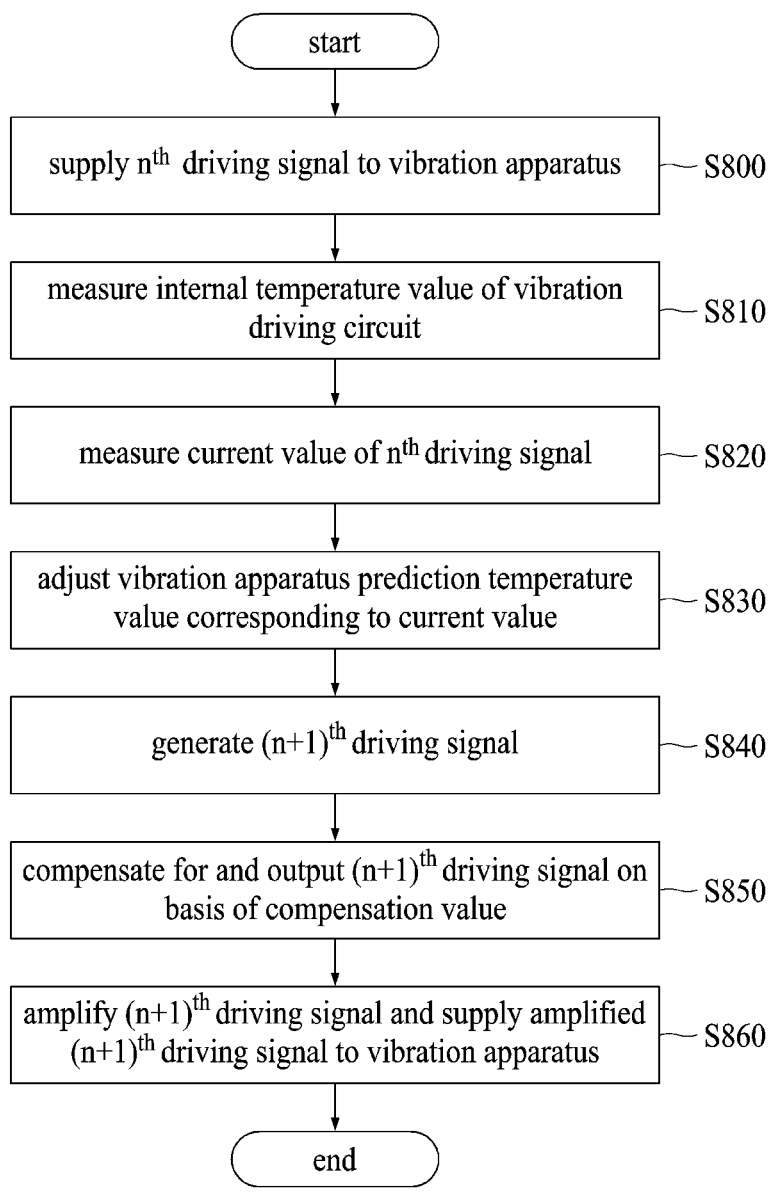
FIG. 8 is a flowchart illustrating an operation of a vibration generating apparatus according to an aspect of the present disclosure.

FIG. 8 is a flowchart illustrating an operation of a vibration generating apparatus according to an aspect of the present disclosure.

With reference to FIGS. 1 and 8, the vibration driving circuit 100 may supply the vibration apparatus 200 with an $n^{th}$ driving signal corresponding to an $n^{th}$ sound source signal in operation S800, and then, the temperature measurer 110 may measure an internal temperature value (or a circuit internal temperature value or a first temperature value) of the vibration driving circuit 100 in operation S810 and the current measurer 120 may measure a current value of the $n^{th}$ driving signal in operation S820. For example, the circuit internal temperature value (or the first temperature value) measured in operation S810 may be supplied to the driving signal generator 140. For example, the current value measured in operation S820 may be supplied to the temperature predictor 130.

In operation S810, the temperature measurer 110 may measure a circuit internal temperature value in at least one region of the vibration driving circuit 100. For example, the temperature measurer 110 may measure at least one circuit internal temperature value.

In operation S810, the temperature measurer 110 may measure a temperature value of an adjacent region of the amplifier 150 disposed within the vibration driving circuit 100.

In operation S820, the current measurer 120 may be connected to the line W between the vibration driving circuit 100 and the vibration apparatus 200 and may measure a current value of the $n^{th}$ driving signal flowing in the line W.

In operation S820, the current measurer 120 may be connected to the portion n of the line W adjacent to the vibration driving circuit 100 and may measure the current value of the $n^{th}$ driving signal at the portion n of the line W.

After operation S820, the temperature predictor 130 may adjust a temperature prediction value of a vibration apparatus (or a second temperature value) corresponding to a current value from the current measurer 120 in operation S830. The temperature prediction value of the vibration apparatus which is adjusted in operation S830 may be supplied to the driving signal generator 140.

In operation S830, the temperature predictor 130 may adjust a temperature prediction value of a vibration apparatus with reference to a current-temperature table which includes a temperature prediction value of a vibration apparatus corresponding to each driving signal current value.

In operation S830, when a driving signal current value measured in operation S820 is supplied from the current measurer 120, the temperature predictor 130 may adjust a temperature prediction value of a vibration apparatus corresponding to the driving signal current value with reference to the current-temperature table.

After operation S830, the driving signal generator 140 may generate an $(n+1)^{th}$ driving signal corresponding to an $(n+1)^{th}$ sound source signal supplied from the sound source supply system 300 in operation S840 and may compensate for the generated $(n+1)^{th}$ driving signal based on a compensation value to output the compensated $(n+1)^{th}$ driving signal in operation S850.

In operation S850, the driving signal generator 140 may compensate for the $(n+1)^{th}$ driving signal based on at least one of the circuit internal temperature value from the temperature measurer 110 and the temperature prediction value of the vibration apparatus from the temperature predictor 130.

In operation S850, the driving signal generator 140 may set or adjust a frequency-based gain compensation value based on at least one of the circuit internal temperature value and the prediction temperature value, of the vibration apparatus compensate for a frequency-based gain of the $(n+1)^{th}$ driving signal based on the adjusted frequency-based gain compensation value, and apply the compensated frequency-based gain to the driving signal to compensate for the driving signal.

In operation S850, the driving signal generator 140 may adjust a frequency-based gain compensation value based on the circuit internal temperature value. For example, the driving signal generator 140 may adjust the frequency-based gain compensation value corresponding to the circuit internal temperature value with reference to a first temperature-compensation table. For example, the first temperature-compensation table may include a compensation value corresponding to each circuit internal temperature value.

In operation S850, the driving signal generator 140 may adjust a frequency-based gain compensation value based on the temperature prediction value of the vibration apparatus.

For example, the driving signal generator 140 may adjust the frequency-based gain compensation value corresponding to the temperature prediction value of the vibration apparatus with reference to a second temperature-compensation table. For example, the second temperature-compensation table may include a compensation value corresponding to each temperature prediction value of the vibration apparatus.

In operation S850, the driving signal generator 140 may adjust a frequency-based gain compensation value based on the circuit internal temperature value and the temperature prediction value of the vibration apparatus. For example, the driving signal generator 140 may adjust the frequency-based gain compensation value corresponding to the circuit internal temperature value and the temperature prediction value of the vibration apparatus with reference to a third temperature-compensation table. For example, the third temperature-compensation table may include a compensation value corresponding to each circuit internal temperature value and each temperature prediction value of the vibration apparatus.

Subsequently, the amplifier 150 amplify the driving signal supplied from the driving signal generator 140 based on a predetermined gain, and then, may supply the amplified driving signal to the vibration apparatus 200 in operation S860.

A vibration generating apparatus according to an aspect of the present disclosure may be applied to a vibration generating apparatus disposed in an apparatus. The apparatus according to an aspect of the present disclosure may be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc. Also, the vibration apparatus according to an aspect of the present disclosure may be applied to organic light emitting lighting apparatuses or inorganic light emitting lighting apparatuses. When the vibration apparatus of an aspect of the present disclosure is applied to lighting apparatuses, the vibration apparatus may act as lighting and a speaker. Also, when the vibration generating apparatus of an aspect of the present disclosure is applied to a mobile device, the vibration generating apparatus may act as one or more of a speaker, a receiver, and a haptic device, but aspects of the present disclosure are not limited thereto.

A vibration generating apparatus, an operating method thereof, and an apparatus including the vibration generating apparatus according to an aspect of the present disclosure will be described below.

A vibration generating apparatus according to some aspects of the present disclosure may comprise a vibration apparatus, and a vibration driving circuit including a driving signal generator configured to supply a driving signal to the vibration apparatus, the driving signal generator may be configured to adjust a frequency-based gain compensation value based on at least one of a circuit internal temperature value of the vibration driving circuit and a temperature prediction value of the vibration apparatus corresponding to a current value of an $n^{th}$ driving signal, compensate for a frequency-based gain value based on the adjusted frequency-based gain compensation value, compensate for an $(n+1)^{th}$ driving signal based on the compensated frequency-based gain value, and supply the compensated $(n+1)^{th}$ driving signal to the vibration apparatus.

According to some aspects of the present disclosure, the vibration driving circuit may comprise a temperature measurer configured to measure the circuit internal temperature value, and the driving signal generator may receive the circuit internal temperature value from the temperature measurer and may adjust the frequency-based gain compensation value corresponding to the circuit internal temperature value.

According to some aspects of the present disclosure, the driving signal generator may be configured to adjust the frequency-based gain compensation value corresponding to the circuit internal temperature value with reference to a first temperature-compensation table including a compensation value corresponding to each circuit internal temperature value.

According to some aspects of the present disclosure, the vibration driving circuit may comprise a current measurer configured to measure a current value of the $n^{th}$ driving signal, and a temperature predictor receiving the current value from the current measurer to output the temperature prediction value corresponding to the current value, and the driving signal generator may be configured to receive the temperature prediction value from the temperature predictor and adjust a frequency-based gain compensation value corresponding to the prediction temperature value.

According to some aspects of the present disclosure, the driving signal generator may be configured to adjust the frequency-based gain compensation value corresponding to the temperature prediction value with reference to a second temperature-compensation table including a compensation value corresponding to each prediction temperature value.

According to some aspects of the present disclosure, the vibration driving circuit may comprise a temperature measurer configured to measure the circuit internal temperature value, a current measurer configured to measure a current value of the $n^{th}$ driving signal, and a temperature predictor configured to receive the current value from the current measurer to output the temperature prediction value corresponding to the current value, and the driving signal generator may be configured to receive the circuit internal temperature value from the temperature measurer and the temperature prediction value from the temperature predictor and adjust a frequency-based gain compensation value corresponding to the circuit internal temperature value and the prediction temperature value.

According to some aspects of the present disclosure, the driving signal generator may be configured to adjust the frequency-based gain compensation value corresponding to the circuit internal temperature value and the temperature prediction value with reference to a third temperature-compensation table including a compensation value corresponding to each circuit internal temperature value and each prediction temperature value.

According to some aspects of the present disclosure, the vibration driving circuit may comprise an amplifier configured to amplify the driving signal from the driving signal generator and supply the amplified driving signal to the vibration apparatus, and the temperature measurer may comprise at least one temperature sensor disposed adjacent to the amplifier.

According to some aspects of the present disclosure, the temperature predictor may be configured to output a temperature prediction value corresponding to a driving signal current value with reference to a current-temperature table including a temperature prediction value corresponding to each driving signal current value.

According to some aspects of the present disclosure, the current measurer may comprise at least one current sensor connected to a portion, which is adjacent to the vibration apparatus, of a line between the vibration driving circuit and the vibration apparatus.

According to some aspects of the present disclosure, the vibration apparatus may comprise one or more of a piezoelectric element and a film type vibration apparatus.

According to some aspects of the present disclosure, the vibration apparatus may comprise a vibration portion, and the vibration portion may comprise a plurality of first portion including an inorganic material and a plurality of second portion between the plurality of first portions, the second portion including an organic material.

According to some aspects of the present disclosure, the vibration apparatus may further comprise a first electrode layer disposed at a first surface of the vibration portion, and a second electrode layer disposed at a second surface different from the first surface of the vibration portion.

According to some aspects of the present disclosure, the first portion may have a piezoelectric characteristic, and the second portion may have ductile characteristic.

An apparatus according to some aspects of the present disclosure may comprise a vibration member, and a vibration generating apparatus vibrating the vibration member comprising a vibration apparatus, and a vibration driving circuit including a driving signal generator that supplies a driving signal to the vibration apparatus, and the driving signal generator may be configured to adjust a frequency-based gain compensation value based on at least one or more of a circuit internal temperature value of the vibration driving circuit and a temperature prediction value of the vibration apparatus corresponding to a current value of an $n^{th}$ driving signal, compensate for a frequency-based gain value based on the adjusted frequency-based gain compensation value, compensate for an $(n+1)^{th}$ driving signal based on the compensated frequency-based gain value, and supply the compensated $(n+1)^{th}$ driving signal to the vibration apparatus.

According to some aspects of the present disclosure, the apparatus may further comprise one or more of a connection member and a plate disposed between the vibration member and the vibration generating apparatus.

According to some aspects of the present disclosure, the vibration member may comprise a plate, and the plate may comprise one of a metal and a single nonmetal or a composite nonmetal of one or more of wood, plastic, glass, cloth, paper, and leather.

According to some aspects of the present disclosure, the vibration member may comprise a display panel including a plurality of pixels configured to display an image, or may comprise one non-display panel of a light emitting diode lighting panel, an organic light emitting lighting panel, and an inorganic light emitting lighting panel.

According to some aspects of the present disclosure, the vibration member may comprise a display panel including a plurality of pixels configured to display an image, or comprises one or more of a vehicle interior material, a vehicle glass window, a building ceiling, a building interior material, a building glass window, an aircraft interior material, and an aircraft glass window.

An operating method of a vibration generating apparatus according to some aspects of the present disclosure may comprise supplying an $n^{th}$ driving signal to a vibration apparatus, measuring a circuit internal temperature value of a vibration driving circuit, measuring a driving signal current value of the $n^{th}$ driving signal, adjusting a temperature prediction value of the vibration apparatus corresponding to the driving signal current value, and generating an $(n+1)^{th}$ driving signal and compensating for the $(n+1)^{th}$ driving signal based on a compensation value.

According to some aspects of the present disclosure, the compensating the $(n+1)^{th}$ driving signal may comprise adjusting a frequency-based gain compensation value based on at least one or more of the circuit internal temperature value and the prediction temperature value, compensating for a frequency-based gain value based on the adjusted frequency-based gain compensation value, and compensating for the $(n+1)^{th}$ driving signal based on the compensated frequency-based gain value.

According to some aspects of the present disclosure, the adjusting the temperature prediction value may comprise adjusting a temperature prediction value corresponding to the driving signal current value with reference to a current-temperature table including a temperature prediction value corresponding to each driving signal current value.

According to some aspects of the present disclosure, the compensating for the $(n+1)^{th}$ driving signal may comprise adjusting a frequency-based gain compensation value corresponding to the circuit internal temperature value with reference to a first temperature-compensation table including a compensation value corresponding to each circuit internal temperature value.

According to some aspects of the present disclosure, the compensating for the $(n+1)^{th}$ driving signal may comprise adjusting a frequency-based gain compensation value corresponding to the temperature prediction value with reference to a second temperature-compensation table including a compensation value corresponding to each prediction temperature value.

According to some aspects of the present disclosure, the compensating for the $(n+1)^{th}$ driving signal may comprise adjusting a frequency-based gain compensation value corresponding to the circuit internal temperature value and the temperature prediction value with reference to a third temperature-compensation table including a compensation value corresponding to each circuit internal temperature value and each prediction temperature value.

A vibration apparatus driver for providing a driving signal to a vibration apparatus according to some aspects of the present disclosure comprises a temperature measurer, configured to measure a circuit internal temperature value of the vibration apparatus driver; a temperature predictor, configured to predict a temperature prediction value of the vibration apparatus based on a current value of the driving signal; and a driving signal generator, configured to adjust a compensation value for the driving signal based on at least one of the circuit internal temperature value of the vibration apparatus driver and the temperature prediction value of the vibration apparatus, and compensate for the driving signal based on the compensation value to output a compensated driving signal.

According to some aspects of the present disclosure, the driving signal generator may be configured to adjust the compensation value based on a temperature compensation table, and the temperature compensation table may comprise a correspondence relationship between at least one of the circuit internal temperature value of the vibration apparatus driver and the temperature prediction value of the vibration apparatus and the compensation value.

According to some aspects of the present disclosure, the compensation value may be a frequency-based gain value.

It will be apparent to those skilled in the art that various modifications and variations can be made in the present disclosure without departing from the technical idea or scope of the disclosures. Thus, it is intended that aspects of the present disclosure cover the modifications and variations of the disclosure provided they come within the scope of the appended claims and their equivalents.

What is claimed is:

1. A vibration generating apparatus, comprising:
a vibration apparatus; and
a vibration driving circuit including a driving signal generator supplying a driving signal to the vibration apparatus,
wherein the driving signal generator is configured to:
adjust a frequency-based gain compensation value based on at least one of a circuit internal temperature value of the vibration driving circuit and a temperature prediction value of the vibration apparatus corresponding to a current value of an $n^{th}$ driving signal,
compensate for a frequency-based gain value based on the adjusted frequency-based gain compensation value,
compensate for an $(n+1)^{th}$ driving signal based on the compensated frequency-based gain value, and
supply the compensated $(n+1)^{th}$ driving signal to the vibration apparatus,
wherein the vibration driving circuit further comprises:
a temperature measurer configured to measure the circuit internal temperature value;
a current measurer configured to measure a current value of the nth driving signal; and
a temperature predictor configured to receive the current value from the current measurer to output the temperature prediction value corresponding to the current value, and
wherein the driving signal generator receives the circuit internal temperature value from the temperature measurer and the temperature prediction value from the temperature predictor and adjusts a frequency-based gain compensation value corresponding to the circuit internal temperature value and the prediction temperature value.

2. The vibration generating apparatus of claim 1, wherein the driving signal generator is configured to adjust the frequency-based gain compensation value corresponding to the circuit internal temperature value and the temperature prediction value with reference to a temperature-compensation table including a compensation value corresponding to each circuit internal temperature value and each prediction temperature value.

3. The vibration generating apparatus of claim 1, wherein the vibration driving circuit comprises an amplifier amplifying the driving signal from the driving signal generator and supplying the amplified driving signal to the vibration apparatus, and
wherein the temperature measurer comprises at least one temperature sensor disposed adjacent to the amplifier.

4. The vibration generating apparatus of claim 1, wherein the temperature predictor is configured to output a temperature prediction value corresponding to a driving signal current value with reference to a current-temperature table including a temperature prediction value corresponding to each driving signal current value.

5. The vibration generating apparatus of claim 1, wherein the current measurer includes at least one current sensor connected to a portion, which is adjacent to the vibration apparatus, of a line between the vibration driving circuit and the vibration apparatus.

6. The vibration generating apparatus of claim 1, wherein the vibration apparatus comprises one or more of a piezoelectric element and a film-type vibration apparatus.

7. The vibration generating apparatus of claim 1, wherein the vibration apparatus includes a vibration portion, and
wherein the vibration portion includes a plurality of first portion including an inorganic material and a plurality of second portion between the plurality of first portions, the second portion including an organic material.

8. The vibration generating apparatus of claim 7, the vibration apparatus further comprises:
a first electrode layer disposed at a first surface of the vibration portion; and
a second electrode layer disposed at a second surface different from the first surface of the vibration portion.

9. The vibration generating apparatus of claim 7, wherein the first portion has a piezoelectric characteristic, and
wherein the second portion has a ductile characteristic.

10. An apparatus, comprising:
a vibration member; and
a vibration generating apparatus vibrating the vibration member and comprising a vibration apparatus, and a vibration driving circuit including a driving signal generator that supplies a driving signal to the vibration apparatus,
wherein the driving signal generator is configured to:
adjust a frequency-based gain compensation value based on at least one of a circuit internal temperature value of the vibration driving circuit and a temperature prediction value of the vibration apparatus corresponding to a current value of an $n^{th}$ driving signal,
compensate for a frequency-based gain value based on the adjusted frequency-based gain compensation value,
compensate for an $(n+1)^{th}$ driving signal based on the compensated frequency-based gain value, and
supply the compensated $(n+1)^{th}$ driving signal to the vibration apparatus,
wherein the vibration driving circuit further comprises:
a temperature measurer configured to measure the circuit internal temperature value;
a current measurer configured to measure a current value of the nth driving signal; and
a temperature predictor configured to receive the current value from the current measurer to output the temperature prediction value corresponding to the current value, and
wherein the driving signal generator receives the circuit internal temperature value from the temperature measurer and the temperature prediction value from the temperature predictor and adjusts a frequency-based gain compensation value corresponding to the circuit internal temperature value and the prediction temperature value.

11. The apparatus of claim 10, further comprising one or more of a connection member and a plate disposed between the vibration member and the vibration generating apparatus.

12. The apparatus of claim 10, wherein the vibration member includes a plate, and
wherein the plate includes one of a metal and a single nonmetal or a composite nonmetal of one or more of wood, plastic, glass, cloth, paper, and leather.

13. The apparatus of claim 10, wherein the vibration member comprises a display panel including a plurality of pixels displaying an image, or comprises one non-display panel of a light emitting diode lighting panel, an organic light emitting lighting panel, and an inorganic light emitting lighting panel.

14. The apparatus of claim 10, wherein the vibration member comprises a display panel including a plurality of pixels displaying an image, or comprises one or more of a vehicle interior material, a vehicle glass window, a building ceiling, a building interior material, a building glass window, an aircraft interior material, and an aircraft glass window.

15. The apparatus of claim 10, wherein the vibration apparatus comprises one or more of a piezoelectric element and a film-type vibration apparatus.

16. The apparatus of claim 10, wherein the vibration apparatus includes a vibration portion, and
   wherein the vibration portion includes:
   a plurality of first portion including an inorganic material; and
   a plurality of second portion between the plurality of first portions, the second portion including an organic material.

17. The apparatus of claim 16, wherein the vibration apparatus further comprises:
   a first electrode layer disposed at a first surface of the vibration portion; and
   a second electrode layer disposed at a second surface of the vibration portion, the second surface of the vibration portion being different from the first surface of the vibration portion.

18. The apparatus of claim 16, wherein:
   each of the plurality of first portion has a piezoelectric characteristic, and
   each of the plurality of second portion has a ductile characteristic.

19. An operating method of a vibration generating apparatus, comprising:
   supplying an $n^{th}$ driving signal to a vibration apparatus;
   measuring a circuit internal temperature value of a vibration driving circuit;
   measuring a driving signal current value of the $n^{th}$ driving signal;
   adjusting a temperature prediction value of the vibration apparatus corresponding to the driving signal current value; and
   generating an $(n+1)^{th}$ driving signal and compensating for the $(n+1)^{th}$ driving signal based on a compensation value,
   wherein the compensating for the (n+1)th driving signal comprises:
   adjusting a frequency-based gain compensation value based on the circuit internal temperature value and the prediction temperature value with reference to a temperature-compensation table including the compensation value corresponding to each circuit internal temperature value and each prediction temperature value;
   compensating for a frequency-based gain value based on the adjusted frequency-based gain compensation value; and
   compensating for the (n+1)th driving signal based on the compensated frequency-based gain value.

20. The operating method of claim 19, wherein the adjusting the temperature prediction value comprises adjusting a temperature prediction value corresponding to the driving signal current value with reference to a current-temperature table including a temperature prediction value corresponding to each driving signal current value.

21. A vibration apparatus driver for providing a driving signal to a vibration apparatus, comprising:
   a temperature measurer, configured to measure a circuit internal temperature value of the vibration apparatus driver;
   a temperature predictor, configured to predict a temperature prediction value of the vibration apparatus based on a current value of the driving signal; and
   a driving signal generator, configured to adjust a compensation value for the driving signal based on the circuit internal temperature value of the vibration apparatus driver and the temperature prediction value of the vibration apparatus, and compensate for the driving signal based on the compensation value to output a compensated driving signal,
   wherein:
   the driving signal generator is configured to adjust the compensation value based on a temperature compensation table; and
   the temperature compensation table comprises a correspondence relationship between at least one of the circuit internal temperature value of the vibration apparatus driver and the temperature prediction value of the vibration apparatus and the compensation value.

22. The vibration apparatus driver according to claim 21, wherein the compensation value is a frequency-based gain value.

* * * * *